(12) United States Patent
Lee

(10) Patent No.: US 9,361,997 B2
(45) Date of Patent: Jun. 7, 2016

(54) STORAGE DEVICES AND METHODS OF OPERATING STORAGE DEVICES

(71) Applicant: SAMSUNG ELECTRONICS CO., LTD., Suwon-Si, Gyeonggi-Do (KR)

(72) Inventor: Ju Seok Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/719,969

(22) Filed: May 22, 2015

(65) Prior Publication Data

US 2016/0055917 A1 Feb. 25, 2016

(30) Foreign Application Priority Data

Aug. 19, 2014 (KR) .................. 10-2014-0107829

(51) Int. Cl.

| | | |
|---|---|---|
| *G11C 16/06* | (2006.01) | |
| *G11C 16/34* | (2006.01) | |
| *G11C 16/04* | (2006.01) | |
| *G11C 16/26* | (2006.01) | |
| *G11C 16/08* | (2006.01) | |
| *G11C 11/56* | (2006.01) | |

(52) U.S. Cl.
CPC ............ *G11C 16/34* (2013.01); *G11C 16/0483* (2013.01); *G11C 16/26* (2013.01); *G11C 11/5642* (2013.01); *G11C 16/08* (2013.01)

(58) Field of Classification Search
CPC ........... G11C 16/08; G11C 2029/1202; G11C 16/10; G11C 2213/71; G11C 8/08; G11C 11/5642; G11C 16/26

USPC .................. 365/185.11, 185.17–185.18, 365/185.21–185.22; 714/718–719
See application file for complete search history.

(56) References Cited

U.S. PATENT DOCUMENTS

| | | |
|---|---|---|
| 5,933,381 A | 8/1999 | Iwata |
| 6,762,974 B1 | 7/2004 | Johnson et al. |
| 7,012,835 B2 | 3/2006 | Gonzalez et al. |
| 7,440,324 B2 | 10/2008 | Mokhlesi |
| 7,477,547 B2 | 1/2009 | Lin |
| 7,679,133 B2 | 3/2010 | Son et al. |
| 7,876,620 B2 | 1/2011 | Mokhlesi et al. |
| 7,990,764 B2 | 8/2011 | Alrod et al. |
| 8,130,544 B2 | 3/2012 | Chou et al. |
| 8,174,881 B2 | 5/2012 | Kwon et al. |
| 8,264,880 B1 | 9/2012 | Yang |
| 8,316,278 B2 | 11/2012 | Ahn et al. |
| 8,339,881 B2 | 12/2012 | Danilak |
| 8,553,466 B2 | 10/2013 | Han et al. |

(Continued)

FOREIGN PATENT DOCUMENTS

| | | |
|---|---|---|
| JP | H11096755 | 4/1999 |
| JP | 2010515202 A | 5/2010 |

(Continued)

*Primary Examiner* — David Lam
(74) *Attorney, Agent, or Firm* — Volentine & Whitt, PLLC

(57) ABSTRACT

A method of operating a storage device may include receiving a read command and a read address, performing a read operation on selected memory cells corresponding to a selected string selection line and a selected word line based on the read address and performing a reliability verification read on unselected memory cells. Data read by the read operation may be output to an external device, and data read by the reliability verification read may be not output to the external device.

30 Claims, 27 Drawing Sheets

(56) References Cited

U.S. PATENT DOCUMENTS

| | | |
|---|---|---|
| 8,559,224 B2 | 10/2013 | Han et al. |
| 8,559,235 B2 | 10/2013 | Yoon et al. |
| 8,654,587 B2 | 2/2014 | Yoon et al. |
| 8,665,647 B2 | 3/2014 | Lee et al. |
| 8,670,272 B2 | 3/2014 | Radke |
| 8,908,431 B2 | 12/2014 | Shim et al. |
| 8,923,053 B2 | 12/2014 | Han et al. |
| 2005/0162913 A1 | 7/2005 | Chen |
| 2005/0213385 A1 | 9/2005 | Hosono et al. |
| 2007/0171722 A1 | 7/2007 | Kang et al. |
| 2008/0101122 A1 | 5/2008 | Kang et al. |
| 2008/0144378 A1 | 6/2008 | Park et al. |
| 2008/0316822 A1 | 12/2008 | Ahn et al. |
| 2009/0323412 A1 | 12/2009 | Mokhlesi et al. |
| 2010/0011156 A1 | 1/2010 | Yim et al. |
| 2010/0235713 A1* | 9/2010 | Lee .................. G06F 11/1072 714/763 |
| 2011/0075484 A1 | 3/2011 | Lee et al. |
| 2011/0119431 A1 | 5/2011 | Chowdhury |
| 2011/0233648 A1 | 9/2011 | Seol et al. |
| 2011/0292726 A1 | 12/2011 | Lee et al. |
| 2012/0170378 A1 | 7/2012 | Aritome et al. |
| 2013/0007353 A1* | 1/2013 | Shim ...................... G11C 16/10 711/103 |
| 2013/0155776 A1 | 6/2013 | Chilappagari et al. |
| 2014/0129904 A1 | 5/2014 | Sakai et al. |
| 2014/0181392 A1 | 6/2014 | Malladi et al. |
| 2014/0181452 A1 | 6/2014 | Malladi et al. |
| 2014/0223246 A1* | 8/2014 | Kim .................. G11C 16/3427 714/718 |
| 2015/0162066 A1 | 6/2015 | Song et al. |
| 2015/0162071 A1 | 6/2015 | Yoon et al. |

FOREIGN PATENT DOCUMENTS

| | | |
|---|---|---|
| KR | 100686274 A | 2/2007 |
| KR | 100841336 A | 6/2008 |
| KR | 100874911 A | 12/2008 |
| KR | 100882841 A | 2/2009 |
| KR | 100899193 A | 5/2009 |
| KR | 1020090129624 A | 12/2009 |
| KR | 1020100006715 A | 1/2010 |
| KR | 1020110034068 A | 4/2011 |
| KR | 1020110038083 A | 4/2011 |
| KR | 1020110132072 A | 12/2011 |

* cited by examiner

FIG. 29

| Status of NVM | Variation of reliability verification read |
|---|---|
| P/E cycle increases | Decreases range or average of RDN, or Perform at least one more reliability verification read |
| Read cycle after program increases | |
| Elapsed time after program increases | |
| Elapsed time after program is shorter than reference time | Skip reliability verification read, or perform at least one more reliability verification read |
| Random data | Perform at least one more (or less) verification read |
| Information of bad cells exists | Perform at least one more reliability verification read according to FIG. 9. or FIG. 13 for bad cells |
| Open block | Adjust target not to include erased memory cells, or Perform at least one more reliability verification read according to FIG. 11 or FIG.14 |

STORAGE DEVICES AND METHODS OF OPERATING STORAGE DEVICES

CROSS-REFERENCE TO RELATED APPLICATIONS

A claim of priority under 35 U.S.C. §119 is made to Korean Patent Application No. 10-2014-0107829, filed on Aug. 19, 2014, in the Korean Intellectual Property Office, the entire contents of which are hereby incorporated by reference.

BACKGROUND

Example embodiments of the inventive concept relate to semiconductor memory devices, and in particular, to storage devices and to methods of operating storage devices.

A storage device is used to store data, under control of a host device (e.g., a computer, a smart phone, a smart pad, and so on). The storage device may include magnetic storage devices (e.g., a hard disk drive (HDD)) and semiconductor storage devices (e.g., a non-volatile memory device configured as a solid state drive (SSD), a memory card, and so on).

Examples of non-volatile memory include a read only memory (ROM), a programmable ROM (PROM), an electrically programmable ROM (EPROM), an electrically erasable and programmable ROM (EEPROM), a flash memory, a phase-change random access memory (PRAM), a magnetic RAM (MRAM), a resistive RAM (RRAM), a ferroelectric RAM (FRAM), and so on.

Progress in semiconductor fabrication technologies has allowed for a rapid increase in integration density and memory capacity of the semiconductor storage device, and generally, the higher the integration density of the semiconductor storage device, the lower the cost per bit of the semiconductor storage device. However, the increase in integration density of the storage device and the consequent scaling down of the storage device have lead to various new technical issues, such as an increase in missing data and deterioration in data reliability.

SUMMARY

According to example embodiments of the inventive concept, provided is a method of operating a storage device including a non-volatile memory and a memory controller configured to control the non-volatile memory. The non-volatile memory may include a plurality of cell strings, which may be arranged in rows and columns on a substrate. Each cell string may include a ground selection transistor, a plurality of memory cells, and a string selection transistor sequentially stacked on the substrate in a direction normal to a top surface of the substrate, where the memory cells of each cell string are located at different levels over the top surface of the substrate. The non-volatile memory may further include first to M-th string selection lines connected to first to M-th rows of the plurality of cell strings respectively, and first to N-th word lines connected to first to N-th levels of memory cells of the plurality of cell strings respectively. Here, the method may include receiving a read command and a read address, performing a read operation on selected memory cells corresponding to a selected string selection line and a selected word line, which may be selected based on the read address, according to the read command, and performing a reliability verification read on unselected memory cells. Data read by the read operation may be output to an external device, and data read by the reliability verification read may be not output to the external device.

In example embodiments, the performing of the reliability verification read may include performing the reliability verification read on memory cells corresponding to an unselected string selection line and the selected word line.

In example embodiments, the performing of the reliability verification read may include performing the reliability verification read on memory cells corresponding to an unselected string selection line and at least one unselected word line adjacent to the selected word line.

In example embodiments, the performing of the reliability verification read may include performing the reliability verification read on memory cells corresponding to the selected string selection line and at least one unselected word line adjacent to the selected word line.

In example embodiments, the performing of the reliability verification read may include performing the reliability verification read on memory cells that are in an erased state.

In example embodiments, the performing of the reliability verification read may include performing the reliability verification read on memory cells corresponding to a predetermined position.

In example embodiments, the reliability verification read may be performed when a count that is incremented with each read operation reaches a random number, and the random number may be updated and the count may be reset when the reliability verification read is performed.

In example embodiments, the random number may be updated in such a way that the random number is generated within a predetermined range or has a predetermined mean value.

In example embodiments, the predetermined range or the mean value may decrease with an increase in a number of erase operations performed on memory cells of the plurality of cell strings.

In example embodiments, the predetermined range or the mean value decrease with an increase in a number of read operations performed on memory cells, in which data may be written.

In example embodiments, the predetermined range or the mean value decrease with an increase in a time elapsed from completion of a program operation of memory cells of the plurality of cell strings.

In example embodiments, the performing of the reliability verification read may include performing the reliability verification read on memory cells corresponding to a first unselected string selection line and the selected word line, performing the reliability verification read on memory cells corresponding to a second unselected string selection line and at least one first unselected word line adjacent to the selected word line, and performing the reliability verification read on memory cells corresponding to the selected string selection line and at least one second unselected word line adjacent to the selected word line.

In example embodiments, the performing of the reliability verification read may include performing the reliability verification read on memory cells corresponding to a first unselected string selection line and the selected word line, when a first count that increments with each read operation reaches a first random number, performing the reliability verification read on memory cells corresponding to a second unselected string selection line and at least one first unselected word line adjacent to the selected word line, when a second count that increments with each read operation reaches a second random number, and performing the reliability verification read on memory cells corresponding to the selected string selection line and at least one second unselected word line adjacent to the selected word line, when a third count that increments with each read operation reaches a third random number.

In example embodiments, the performing of the reliability verification read may include generating a random number, performing the reliability verification read on memory cells corresponding to a first unselected string selection line and the selected word line, when the random number is within a first range, performing the reliability verification read on memory cells corresponding to a second unselected string selection line and at least one first unselected word line adjacent to the selected word line, when the random number is within a second range, and performing the reliability verification read on memory cells corresponding to the selected string selection line and at least one second unselected word line adjacent to the selected word line, when the random number is within a third range.

In example embodiments, the method may further include prohibiting memory cells of the plurality of cell strings from being written, when memory cells, on which the reliability verification read has been performed, are in an erased state and a bit error rate of the reliability verification read is higher than or equal to a critical value.

In example embodiments, the method may further include performing a read reclaim, when memory cells, on which the reliability verification read has been performed, are not in an erased state and a bit error rate of the reliability verification read is higher than or equal to a critical value.

In example embodiments, the performing of the read reclaim may include performing a first read reclaim on data of the memory cells, on which the reliability verification read has been performed.

In example embodiments, the performing of the read reclaim may further include performing a second read reclaim on data of remaining memory cells, after the performing of the first read reclaim.

According to example embodiments of the inventive concept, provided is a method of operating a storage device including a non-volatile memory and a memory controller configured to control the non-volatile memory. The non-volatile memory may include a plurality of cell strings arranged in rows and columns on a substrate, each cell string including a ground selection transistor, a plurality of memory cells, and a string selection transistor sequentially stacked on the substrate in a direction normal to a top surface of the substrate. The method may include receiving a read command and a read address, reading data from memory cells selected by the read address and outputting the read data to an external device, in response to the read command, reading data from unselected memory cells of the memory cells unselected by the read address and determining whether to perform a read reclaim on the unselected memory cells, based on the result of the reading on the unselected memory cells, in response to the read command.

According to example embodiments of the inventive concept, a storage device may include a non-volatile memory including a plurality of cell strings arranged in rows and columns on a substrate and a memory controller configured to control the non-volatile memory. Each cell string may include a ground selection transistor, a plurality of memory cells, and a string selection transistor sequentially stacked on the substrate in a direction normal to a top surface of the substrate, and the memory controller may be configured to read data from selected memory cells of the non-volatile memory in response to a request from an external device, to read data from unselected memory cells adjacent to the selected memory cells, and determine whether to perform a read reclaim on the unselected memory cells, depending on the result of the reading on the unselected memory cells.

In example embodiments, the memory controller may be configured to control the reading on the unselected memory cells in a different manner, depending on a position of a word line connected to the unselected memory cells.

In example embodiments, in the case where, from the result of the reading on the unselected memory cells, there is no need to perform the read reclaim on the unselected memory cells, the memory controller may be configured to perform a read operation on second unselected memory cells, other than the unselected memory cells.

According to example embodiments of the inventive concept, provided is a storage device comprising a non-volatile memory and a memory controller. The non-volatile memory includes a plurality of cell strings arranged in rows and columns on a substrate, each cell string including a ground selection transistor, a plurality of memory cells, and a string selection transistor sequentially stacked on the substrate in a direction normal to a top surface of the substrate. The memory controller is configured to control the non-volatile memory. The memory controller is further configured to read data from selected memory cells of the non-volatile memory in response to a request from an external device, to read data from unselected memory cells, and determine whether to perform a read reclaim on the unselected memory cells, depending on the result of the reading on the unselected memory cells.

According to example embodiments of the inventive concept, provided is a storage device comprising a non-volatile memory and a memory controller. The non-volatile memory includes a plurality of memory blocks, each memory block including a plurality of cell strings arranged in rows and columns on a substrate, each cell string including a ground selection transistor, a plurality of memory cells, and a string selection transistor sequentially stacked on the substrate in a direction normal to a top surface of the substrate. The memory controller is configured to control the non-volatile memory. The memory controller is configured to receive a read command and a read address, perform a read operation on selected memory cells corresponding to a selected string selection line and a selected word line according to the read address, output data read by the read operation to an external device, and perform a reliability verification read on unselected memory cells. Data read by the reliability verification read are not output to the external device. The selected memory cells and the unselected memory cells belong to a same memory block.

BRIEF DESCRIPTION OF THE DRAWINGS

Example embodiments will be more clearly understood from the detailed description that follows taken in conjunction with the accompanying drawings. The accompanying drawings represent non-limiting, example embodiments as described herein.

FIG. 29 is a table exemplarily illustrating a method of controlling an operation condition for the reliability verification read.

Figure 1:
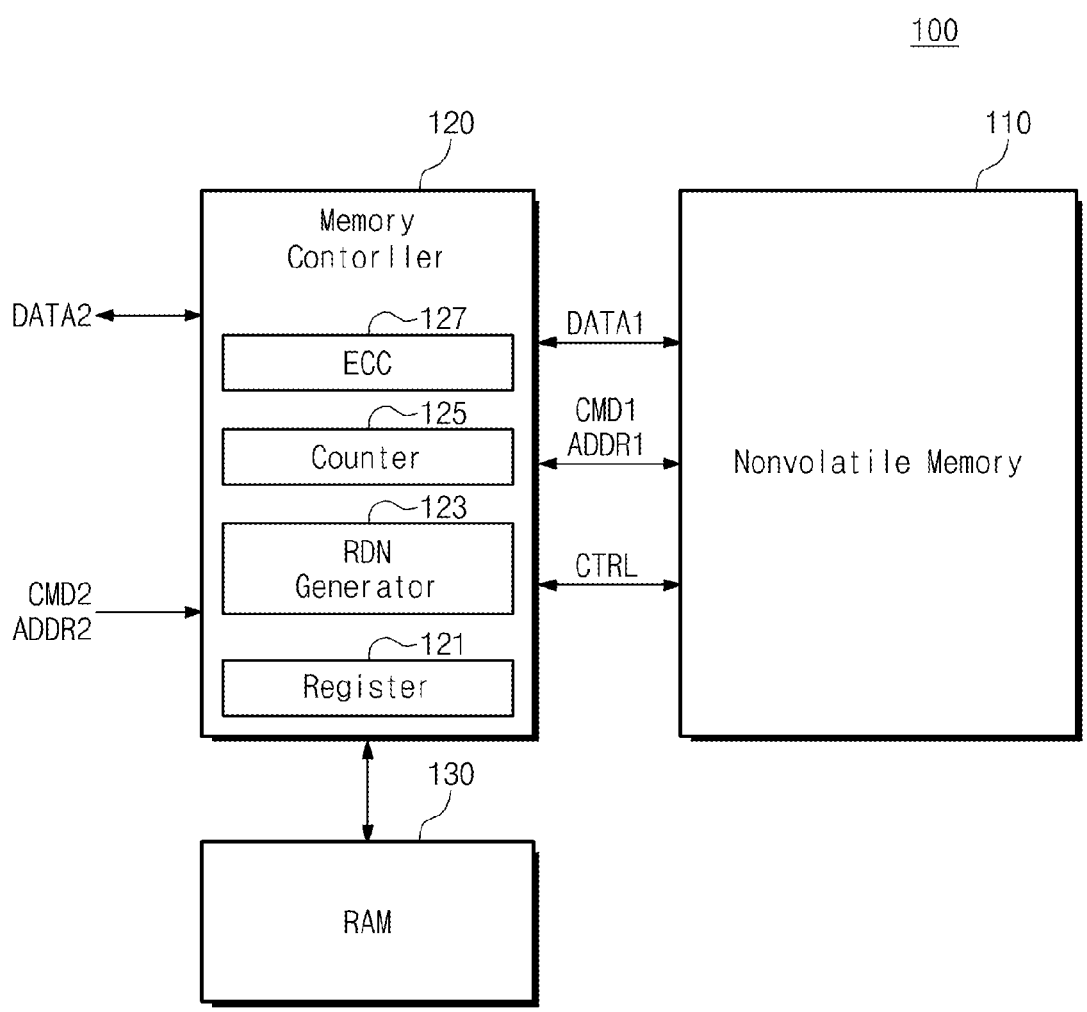
FIG. 1 is a block diagram schematically illustrating a storage device according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram schematically illustrating a storage device 100 according to an embodiment of the inventive concept. Referring to FIG. 1, a storage device 100 may include a non-volatile memory 110, a memory controller 120, and a random access memory (RAM) 130.

The non-volatile memory 110 may perform write, read, and erase operations in response to control signals output from the memory controller 120. The non-volatile memory 110 may exchange a first data DATA1 with the memory controller 120. For example, the non-volatile memory 110 may receive a first data DATA1 from the memory controller 120 and store the first data DATA1 therein. The non-volatile memory 110 may perform a read operation for reading out the first data DATA1 and output the first data DATA1 to the memory controller 120.

The non-volatile memory 110 may receive a first command CMD1 and a first address ADDR1 from the memory controller 120. Further, the non-volatile memory 110 may exchange a control signal CTRL with the memory controller 120. For example, the non-volatile memory 110 may be configured to receive at least one of a chip selection signal /CE, a command latch enable signal CLE, an address latch enable signal ALE, a read enable signal /RE, a write enable signal /WE, a write protect signal /WP, or a data strobe signal DQS, from the memory controller 120. Here, the chip selection signal /CE may be used to select at least one of multiple semiconductor chips constituting the non-volatile memory 110, the command latch enable signal CLE may be used to indicate that a signal received from the memory controller 120 is the first command CMD1, and the address latch enable signal ALE may be used to indicate that a signal received from the memory controller 120 is the first address ADDR1. The read enable signal /RE may be periodically toggled by the memory controller 120 during a read operation and may be used to adjust a timing of the read operation, and the write enable signal /WE may be activated by the memory controller 120, when the non-volatile memory 110 receives the first command CMD1 or the first address ADDR1. The write protect signal /WP may be activated by the memory controller 120 to prevent an unintended write or erase operation from being performed, when an electric power state is changed. The data strobe signal DQS may be periodically toggled by the memory controller 120 during a write operation and may be used to input the first data DATA1 to the non-volatile memory 110 in a synchronized manner. Further, the non-volatile memory 110 may output at least one of a ready-and-busy signal R/nB or a data strobe signal DQS to the memory controller 120. The ready-and-busy signal R/nB may be used to indicate whether the non-volatile memory 110 is performing a program, erase, or read operation, and the data strobe signal DQS may be generated from the read enable signal /RE by the non-volatile memory 110 and be periodically toggled to allow the non-volatile memory 110 to output the first data DATA1 in a synchronized manner.

The non-volatile memory 110 may include a FLASH memory, but example embodiments of the inventive concepts may not be limited thereto. For example, the non-volatile memory 110 may include at least one of a variety of different types of non-volatile memories, such as a phase-change random access memory (PRAM), a magnetic RAM (MRAM), a resistive RAM (RRAM), a ferroelectric RAM (FRAM), and so on.

The memory controller 120 may be configured to control the non-volatile memory 110. For example, the non-volatile memory 110 may perform its own write, read, or erase operation under the control of the memory controller 120. The memory controller 120 may exchange the first data DATA1 and the control signal CTRL with the non-volatile memory 110 and output the first command CMD1 and the first address ADDR1 to the non-volatile memory 110.

The memory controller 120 may control the non-volatile memory 110 under the control of an external host device (not shown). The memory controller 120 may exchange a second data DATA2 with the host device and receive a second command CMD2 and a second address ADDR2 from the host device.

As an example, the memory controller 120 may exchange the first data DATA1 with the non-volatile memory 110 by a first unit (e.g., time unit or transmission unit) and may exchange the second data DATA2 with the host device by a second unit (e.g., time unit or transmission unit) that is different from the first unit. Here, the first and second units may be defined on the basis of a temporal length or a data size.

The memory controller 120 may perform the operations of exchanging the first data DATA1, in a first data format, with the non-volatile memory 110 and transmitting the first command CMD1 and the first address ADDR1 to the non-volatile memory 110. The memory controller 120 may perform the operations of exchanging the second data DATA2, in a second data format that is different from the first format, with the host device and receiving the second command CMD2 and the second address ADDR2 from the host device.

The memory controller 120 may operate the RAM 130 in such a way that the RAM 130 is used as a buffer memory, a cache memory, or an operation memory. For example, the memory controller 120 may receive the second data DATA2 from the host device, store the received second data DATA2 in the RAM 130, and write the second data DATA2 stored in the RAM 130 in the non-volatile memory 110 as the first data DATA1. The memory controller 120 may read the first data DATA1 from the non-volatile memory 110, store the received first data DATA1 in the RAM 130, and output the first data DATA1 stored in the RAM 130 to the host device as the second data DATA2. The memory controller 120 may read the first data DATA1 from the non-volatile memory 110, store the read first data DATA1 in the RAM 130, and write the first data DATA1 stored in the RAM 130 in the non-volatile memory 110 again.

The memory controller 120 may store a data or code, which is needed to manage the non-volatile memory 110, in the RAM 130. For example, the memory controller 120 may read a data or code, which may be needed to manage the non-volatile memory 110, from the non-volatile memory 110 and may load the data or code on the RAM 130, when the data or code is needed to operate the non-volatile memory 110.

The memory controller 120 may include a register 121, a random number generator 123, a counter 125, and an error correction block 127.

The register 121 may store information on a condition under which a random number RDN is generated by the random number generator 123. For example, the register 121 may store information on a range or mean value of the random number RDN. The register 121 may store information on a condition for generating two or more random numbers RDN.

The random number generator 123 may generate the random number RDN, based on the condition stored in the register 121. The random number generator 123 may generate two or more random numbers RDNs.

The counter 125 may count the number of read operations performed in the non-volatile memory 110. For example, the counter 125 may count the number of read operations performed in each erase unit (e.g., a memory block and a sub block) of the non-volatile memory 110. If the count reaches the random number RDN generated by the random number generator 123, the count may be initialized by the counter 125. If the count reaches the random number RDN generated by the random number generator 123, the random number generator 123 may update the random number RDN, on the basis of the condition stored in the register 121.

The error correction block 127 may correct an error of the first data DATA1 that has been read from the non-volatile memory 110. For example, when the first data DATA1 is written in the non-volatile memory 110, the error correction block 127 may generate a parity data on the basis of the first data DATA1. The generated parity data, along with the first data DATA1, may be stored in the non-volatile memory 110. When the first data DATA1 is read from the non-volatile memory 110, the parity data may also be read from the non-volatile memory 110. The error correction block 127 may correct an error of the first data DATA1, using the parity data read. The error correction block 127 may calculate a bit error rate (BER) of the obtained first data DATA1. In another embodiment, the error correction block 127 may calculate a bit error rate of erased memory cells. For example, the erased memory cells may be read using a read voltage. The read voltage may be a voltage defined for calculating a bit error rate of erased memory cells or a voltage having lowest level among read voltages normally used by the non-volatile memory 110. Off cells which have threshold voltages higher than the read voltage, among the erased memory cells read, may be judged as error cells. The error correction block 127 may count the number of off cells among the erased memory cells read. The error correction block 127 may calculate a bit error rate based on the counted number.

The memory controller 120 may receive a read command, which serves as the second command CMD2. The memory controller 120 may perform a read operation on selected memory cells of the non-volatile memory 110 in response to the second command CMD2 received. If the count of the counter 125 reaches the random number RDN, the memory controller 120 may perform a reliability verification read on neighboring memory cells that are positioned adjacent to the selected memory cells, to which the read operation has been performed. If a bit error rate of the first data DATA1 obtained by the reliability verification read is higher than a critical value, the memory controller 120 may perform a read reclaim operation on an erase unit (e.g., a memory block or an erase block), in which the neighboring memory cells are included. The reliability verification read and the subsequent operations associated therewith will be described later in more detail with reference to the accompanying drawings.

The RAM 130 may include at least one of a variety of different types of random access memories, such as a dynamic RAM (DRAM), a static RAM (SRAM), a synchronous DRAM (SDRAM), a PRAM, an MRAM, an RRAM, a FeRAM, and so on.

To reduce an overhead in an erase operation of the non-volatile memory 110, the storage device 100 may perform an address mapping operation. For example, in the case where an overwriting operation is requested from an external host device, the storage device 100 may erase memory cells, in which old data were stored, and store the data, to which the overwriting operation is requested, in memory cells included in a free memory space, not in the erased memory cells. The memory controller 120 may operate a FTL (Flash Translation Layer), in which a logical address to be used in an external host device and a physical address to be used in the non-volatile memory 110 are mapped to each other in accordance with the above method. For example, the second address ADDR2 may be a logical address, and the first address ADDR1 may be a physical address.

The storage device 100 may perform write, read, and erase operations in response to request from a host device. The storage device 100 may include a solid state drive (SSD) or a hard disk drive (HDD). The storage device 100 may include at least one of memory cards, such as a PC card (e.g., personal computer memory card international association (PCM-CIA)), a compact FLASH card (CF), a smart media card (SM, SMC), a memory stick, a multimedia card (e.g., MMC, RS-MMC, MMCmicro), an SD card (SD, miniSD, microSD, SDHC), a universal serial bus (USB) memory card, or a universal FLASH storage (UFS). The storage device 100 may include at least one of mounting-type memories, such as embedded MultiMedia Card (eMMC), UFS, Perfect Page New (PPN).

Figure 2:
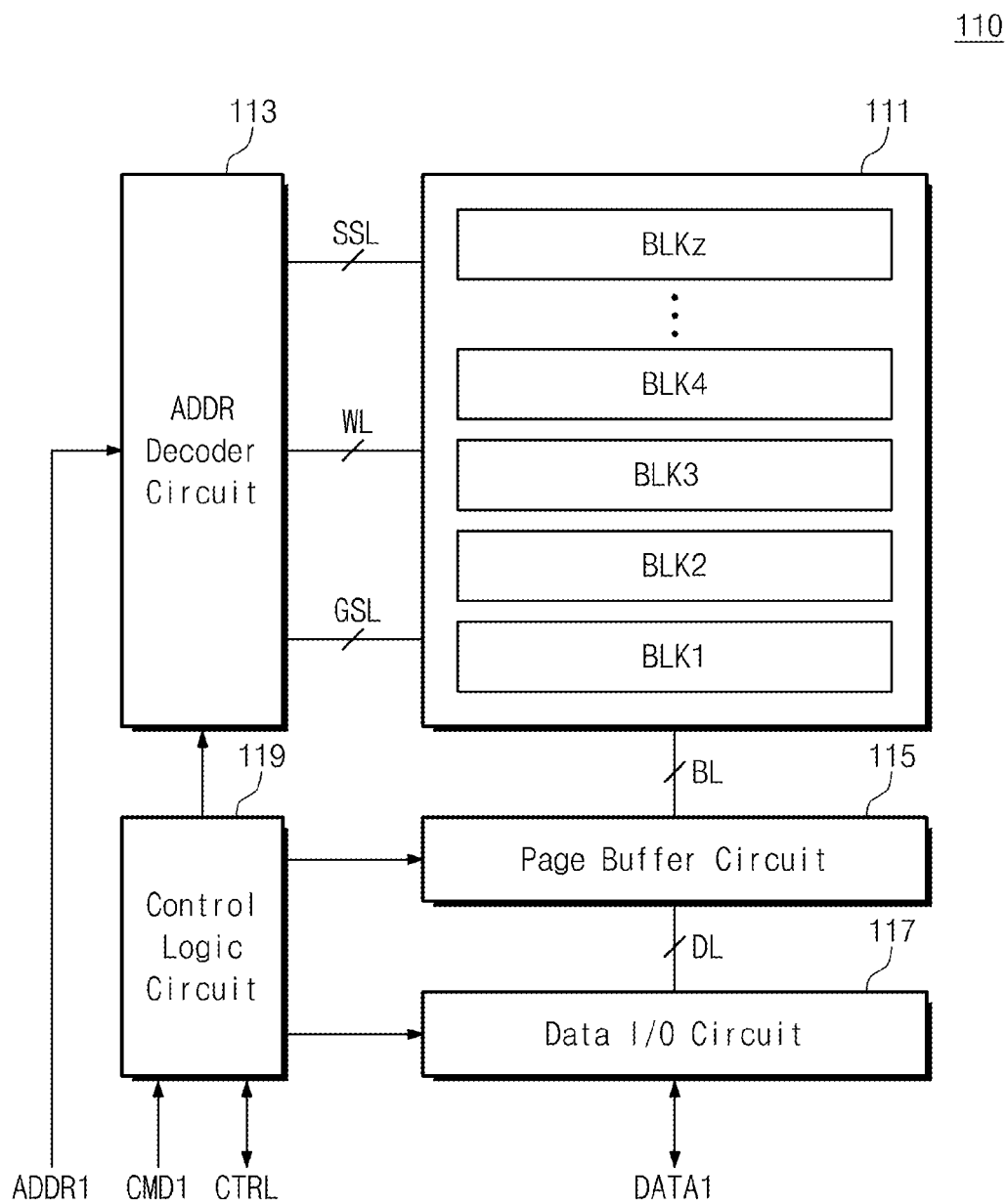
FIG. 2 is a block diagram schematically illustrating a non-volatile memory according to an embodiment of the inventive concept.

FIG. 2 is a block diagram schematically illustrating the non-volatile memory 110 according to an embodiment of the inventive concept. Referring to FIGS. 1 and 2, the non-volatile memory 110 includes a memory cell array 111, an address decoder circuit 113, a page buffer circuit 115, a data input/output circuit 117, and a control logic circuit 119.

The memory cell array 111 may include a plurality of memory blocks BLK1-BLKz, each of which includes a plurality of memory cells. Each memory block may be connected to the address decoder circuit 113 through at least one string selection line SSL, a plurality of word lines WL, and at least one ground selection line GSL. Each of the memory blocks BLK1-BLKz may be connected to the page buffer circuit 115 through a plurality of bit lines BL. Plural ones of the memory blocks BLK1-BLKz may be connected in common to the plurality of bit lines BL. Memory cells of the memory blocks BLK1-BLKz may have the same structure. In example embodiments, each of the memory blocks BLK1-BLKz may be the unit of the erase operation. In other words, the memory cells of the memory cell array 111 may be erased in the unit of each memory block. Further, memory cells constituting each memory block may be simultaneously erased. In other embodiments, each memory block may be divided into a plurality of sub blocks, and in this case a sub block may be the unit of the erase operation.

The address decoder circuit 113 may be connected to the memory cell array 111 through a plurality of ground selection lines GSL, the plurality of word lines WL, and a plurality of string selection lines SSL. The address decoder circuit 113 may operate under the control of the control logic circuit 119. The address decoder circuit 113 receives the first address ADDR1 from the memory controller 120. The address decoder circuit 113 may decode the first address ADDR1 and control voltages to be applied to the word lines WL according to the decoded address.

As an example, during a program operation, the address decoder circuit 113 may apply a program voltage VGPM to a selected word line of a selected memory block designated by the first address ADDR1 and apply a pass voltage VPASS to unselected word lines of the selected memory block. During a read operation, an address decoder circuit 113 may apply a selection read voltage VRD to a selected word line of a selected memory block designated by the first address ADDR1 and apply an unselected read voltage VREAD to unselected word lines of the selected memory block. During an erase operation, the address decoder circuit 113 may apply an erase voltage (e.g., a ground voltage) to word lines of a selected memory block designated by the first address ADDR1.

The page buffer circuit 115 may be connected to the memory cell array 111 through the bit lines BL. The page buffer circuit 115 may be connected to the data input/output circuit 117 through a plurality of data lines DL. The page buffer circuit 115 may operate under the control of the control logic circuit 119.

The page buffer circuit 115 may hold data to be programmed at memory cells of the memory cell array 111 or data read from memory cells thereof. During a program operation, the page buffer circuit 115 may store data to be stored in memory cells. The page buffer circuit 115 may bias the plurality of bit lines BL, based on the stored data. The page buffer circuit 115 may serve as a write driver at a program operation. During a read operation, the page buffer circuit 115 may sense voltages on the bit lines BL and store sensing results. The page buffer circuit 115 may serve as a sense amplifier at a read operation.

The data input/output circuit 117 may be connected to the page buffer circuit 115 through the data lines DL. The data input/output circuit 117 may exchange the first data DATA1 with the memory controller 120.

The data input/output circuit 117 may be configured to store data transmitted from the memory controller 120 temporarily and may transfer it to the page buffer circuit 115. The data input/output circuit 117 may also be configured to store data transferred from the page buffer circuit 115 and may transfer it to the memory controller 120. The data input/output circuit 117 may serve as a buffer memory.

The control logic circuit 119 may receive the first command CMD1 and the control signal CTRL from the memory controller 120. The control logic circuit 119 may decode the received first command CMD1 and control an overall operation of the non-volatile memory 110, based on the decoded command.

In example embodiments, during a read operation, the control logic circuit 119 may generate and output the data strobe signal DQS from the read enable signal /RE, which is included in the received control signal CTRL. During a write operation, the control logic circuit 119 may generate and output the data strobe signal DQS, which is included in the received control signal CTRL, from the data strobe signal DQS.

Figure 3:
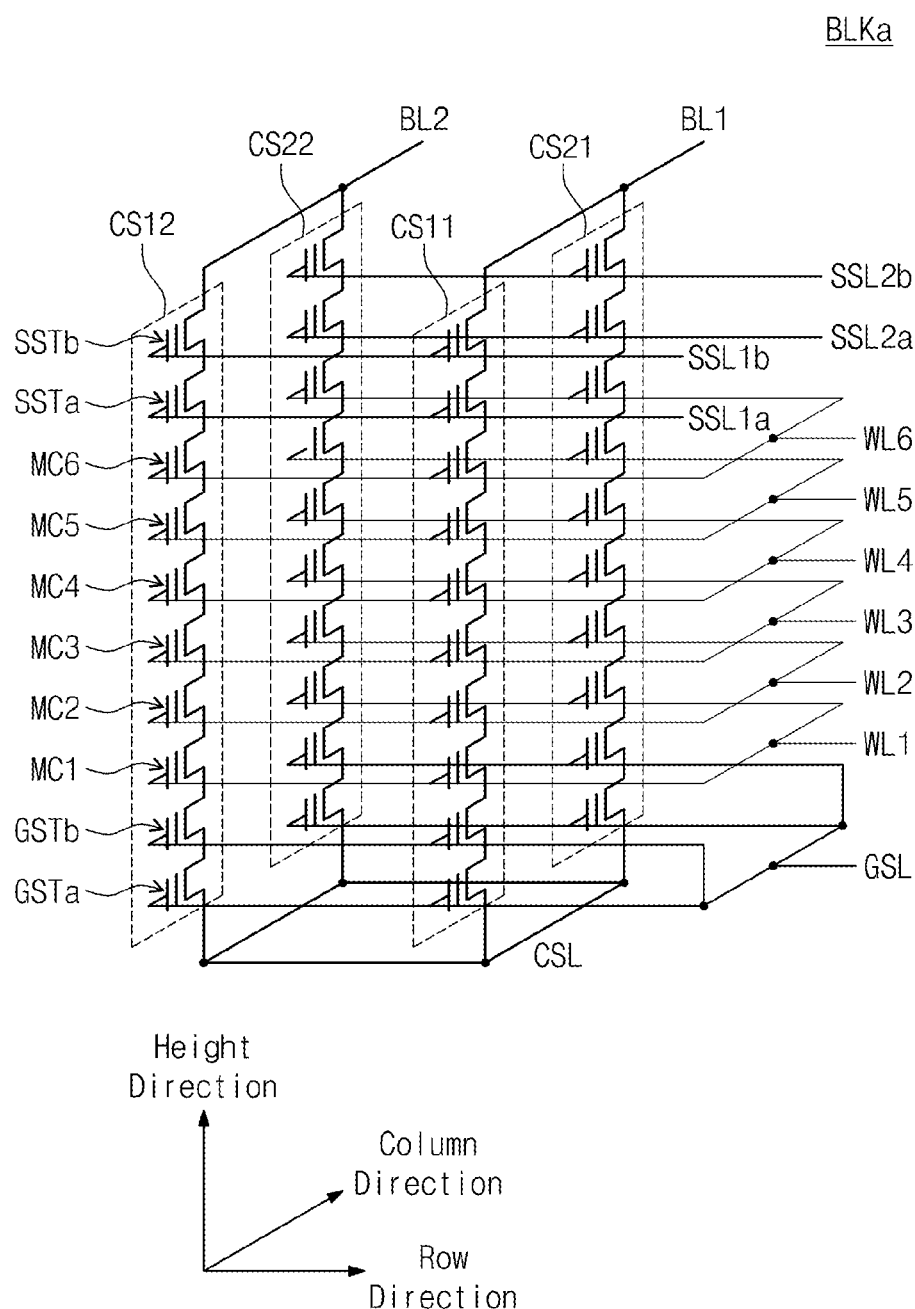
FIG. 3 is a circuit diagram schematically illustrating a memory block according to an embodiment of the inventive concept.

FIG. 3 is a circuit diagram schematically illustrating a memory block BLKa according to an embodiment of the inventive concept. Referring to FIG. 3, a memory block BLKa may include a plurality of cell strings CS11-CS21 and CS12-CS22. The cell strings CS11-CS21 and CS12-CS22 may be arranged in row and column directions to form a plurality of rows and a plurality of columns.

As an example, the cell strings CS11 and CS12 may be arranged along the row direction to form a first row, and the cell strings CS21 and CS22 may be arranged along the row direction to form a second row. The cell strings CS11 and CS21 may be arranged along the column direction to form a first column, and the cell strings CS12 and CS22 may be arranged along the column direction to form a second column.

Each of the cell strings may include a plurality of transistors. For example, each of the cell strings may include ground selection transistors GSTa and GSTb, memory cells MC1-MC6, and string selection transistors SSTa and SSTb. In each cell string, the ground selection transistors GSTa and GSTb, the memory cells MC1-MC6, and the string selection transistors SSTa and SSTb may be stacked in a height direction that is normal to a horizontal plane (e.g., a top surface of a semiconductor substrate, on which the cell strings CS11-CS21 and CS12-CS22 are integrated).

Each cell transistor may be a charge-trap-type transistor, whose threshold voltage is changed depending on an amount of electric charges trapped in its insulation film.

The ground selection transistors GSTa, which is positioned at the lowermost level in each cell string, may be connected in common to a common source line CSL.

The ground selection transistors GSTa and GSTb of the cell strings CS11-CS21 and CS12-CS22 may be connected in common to a ground selection line GSL.

In example embodiments, ground selection transistors located at the same level (in the height direction) may be connected to the same ground selection line, and ground selection transistors located at different levels may be connected to different ground selection lines. For example, the ground selection transistors GSTa at a first level may be connected in common to a first ground selection line, and the ground selection transistors GSTb at a second level may be connected in common to a second ground selection line.

In exemplary embodiments, ground selection transistors in the same row may be connected to the same ground selection line, and ground selection transistors in different rows may be connected to different ground selection lines. For example, the ground selection transistors GSTa and GSTb of the cell strings CS11 and CS12 in the first row may be connected in common to the first ground selection line, and the ground selection transistors GSTa and GSTb of the cell strings CS21 and CS22 in the second row may be connected in common to the second ground selection line.

Memory cells that are located at the same level from the substrate (or, the ground selection transistors GST) may be connected in common to a word line, and memory cells that are placed at different heights (or, orders) may be connected to different word lines WL1-WL6. For example, the memory cells MC1 may be connected in common to the word line WL1, the memory cells MC2 may be connected in common to the word line WL2, and the memory cells MC3 may be connected in common to the word line WL3. The memory cells MC4 may be connected in common to the word line WL4, the memory cells MC5 may be connected in common to the word line WL5, and the memory cells MC6 may be connected in common to the word line WL6.

In the cell strings CS11-CS21 and CS12-CS22, the first string selection transistors SSTa, which are located at the same level to form different rows, may be connected to different string selection lines SSL1a and SSL2a. For example, the first string selection transistors SSTa of the cell strings CS11 and CS12 may be connected in common to the string selection line SSL1a, and the first string selection transistors SSTa of the cell strings CS21 and CS22 may be connected in common to the string selection line SSL2a.

In the cell strings CS11-CS21 and CS12-CS22, the second string selection transistors SSTb, which are located at the same level to form different rows, may be connected to the different string selection lines SSL1a and SSL2a. For example, the second string selection transistors SSTb of the cell strings CS11 and CS12 may be connected in common to the string selection line SSL1b, and the second string selection transistors SSTb of the cell strings CS21 and CS22 may be connected in common to the string selection line SSL2b.

That is, cell strings in different rows may be connected to different string selection lines. Of cell strings in the same row, the string selection transistors, located at the same level, may be connected to the same string selection line. Of cell strings in the same row, the string selection transistors, located at different levels, may be connected to different string selection lines.

In exemplary embodiments, string selection transistors of cell strings in the same row may be connected in common to a string selection line. For example, string selection transistors SSTa and SSTb of cell strings CS11 and CS12 in the first row may be connected in common to a string selection line, and string selection transistors SSTa and SSTb of cell strings CS21 and CS22 in the second row may be connected in common to another string selection line.

Columns of the cell strings CS11-CS21 and CS12-CS22 may be connected to different bit lines BL1 and BL2, respectively. For example, string selection transistors SSTb of the cell strings CS11 and CS21 in the first column may be connected in common to the bit line BL1, and string selection transistors SSTb of the cell strings CS12 and CS22 in the second column may be connected in common to the bit line BL2.

The cell strings CS11 and CS12 may define a first plane. The cell strings CS21 and CS22 may define a second plane.

In the memory block BLKa, write and read operations may be performed in each row. For example, the string selection lines SSL1a, SSL1b, SSL2a, and SSL2b may be used to select one plane from the memory block BKLa. In the case where the string selection lines SSL1a and SSL1b are applied with a turn-on voltage and the string selection lines SSL2a and SSL2b are applied with a turn-off voltage, the cell strings CS11 and CS12 of the first plane may be connected to the bit lines BL1 and BL2, respectively; that is, the first plane is selected. In the case where the string selection lines SSL2a and SSL2b are applied with the turn-on voltage and the string selection lines SSL1a and SSL1b are applied with the turn-off voltage, the cell strings CS21 and CS22 of the second plane may be connected to the bit lines BL1 and Bl2, respectively; that is, the second plane is selected. If a plane is selected, the word lines WL1-WL6 may be used to select one row from the selected plane. The write or read operations may be performed on the selected row.

In the memory block BLKa, a plurality of page data may be programmed in the memory cells of each row. A plurality of bits may be programmed in each memory cell in each row. In this case, bits to be firstly programmed in each of the memory cells of each row may form a Least Significant Bit (LSB) page data, and bits to be lastly programmed in each of the memory cells of each row may form a Most Significant Bit (MSB) page data. Intermediate bits to be programmed (between the LSB and MSB pages) in each of the memory cells of each row may form a Central Significant Bit (CSB) page data. In the case where there are multiple bits between the LSB and MSB pages (i.e., where each cell stores four or more bits), multiple CSB page data may be formed. In other words, the number of bits to be programmed in each memory cell may be equal to the number of the data pages in each row of the memory cells.

In the memory block BLKa, an erase operation may be performed on each memory block unit or each sub block. In the case where the erase operation is performed on each memory block, all the memory cells MC in the memory block BLKa may be simultaneously erased by a single erase request. In the case where the erase operation is performed on each sub block, some of the memory cells MC in the memory block BLKa may be simultaneously erased by a single erase request and the others may be prohibited from being erased. A word line connected to the to-be-erased memory cells may be applied with a low voltage (e.g., ground voltage), and other word line connected to the erase-prohibited memory cells may be in a floating state.

The inventive concept is not limited to the example of the memory block BLKa shown in FIG. 3. For example, the number of rows of cell strings may increase or decrease relative to that of FIG. 3. In the case where the number of rows of cell strings is changed, the number of string or ground selection lines and the number of cell strings connected to a bit line may also be changed from that shown in FIG. 3.

The number of columns of cell strings may increase or decrease relative to that shown in FIG. 3. In the case where the number of columns of cell strings is changed, the number of bit lines connected to columns of cell strings and the number of cell strings connected to a string selection line may also be changed.

A height of the cell strings may increase or decrease relative to that shown in FIG. 3. For example, the number of ground selection transistors, memory cells, or string selection transistors that are stacked in each cell string may increase or decrease.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string further includes at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 4:
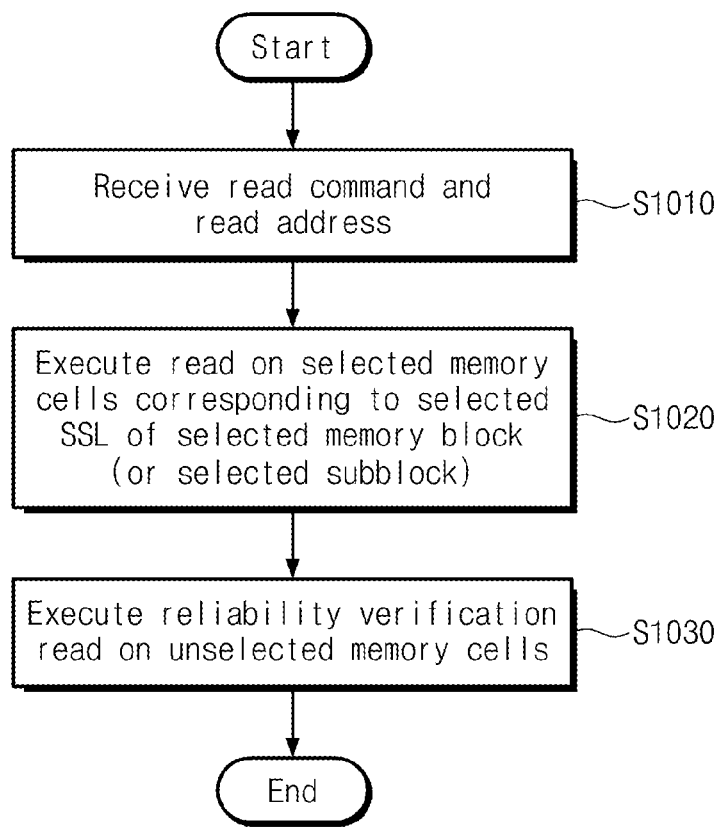
FIG. 4 is a flow chart illustrating a method of operating a storage device according to an embodiment of the inventive concept.

FIG. 4 is a flow chart illustrating a method of operating the storage device 100 according to an embodiment of the inventive concept. Referring to FIGS. 1 through 4, in Step S1010, a storage device 100 may receive a read command and a read address. For example, the storage device 100 may receive the read command as the second command CMD2 and the read address as the second address ADDR2, from an external host device.

In Step S1020, a read operation may be performed on memory cells, which are selected by a selected string selection line SSL of a selected memory block or a selected sub block. For example, the memory controller 120 may select a memory block or a sub block designated by the read address. Further, the memory controller 120 may select a string selection line SSL and a word line WL designated by the read address. The memory controller 120 may perform the read operation on selected memory cells, which are included in the selected memory block or the selected sub block and are selected by the selected string selection line SSL and the selected word line WL.

In Step S1030, a reliability verification read may be performed on unselected memory cells. For example, the memory controller 120 may perform the reliability verification read, based on the read address received in Step S1010. Under the control of the memory controller 120, the reliability verification read may be performed on unselected memory cells, which are included in the memory block or the sub block designated by the read address but are not selected by the read address. The memory controller 120 may perform the reliability verification read on unselected memory cells sharing the selected string selection line SSL with the selected memory cells in the selected memory block or the selected sub block. The memory controller 120 may perform the reliability verification read on unselected memory cells corresponding to an unselected string selection line SSL. The memory controller 120 may perform the reliability verification read on unselected memory cells sharing the selected word line WL with the selected memory cells.

In the read operation, a voltage for specifying threshold voltages of the selected memory cells may be applied to the selected word line. In the read operation, a read voltage of high voltage may be applied to the unselected word lines of the selected memory block. Threshold voltages of the unselected memory cells of the selected memory block may be changed by the read voltage. In other words, the read voltage may disturb the threshold voltages of the unselected memory cells. The reliability verification read may be performed to evaluate an extent of the disturbance on the unselected memory cells of the selected memory block or the selected sub block. In example embodiments, the reliability verification read may include steps of reading data from the unselected memory cells and measuring a bit error rate of the data read.

Figure 5:
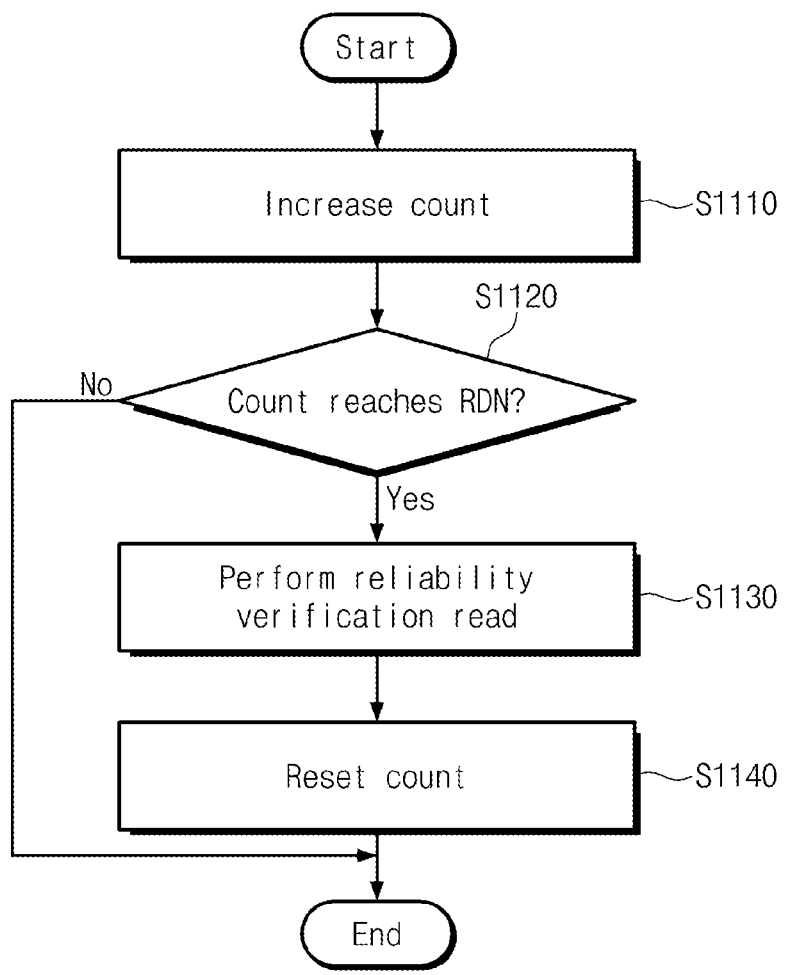
FIG. 5 is a flow chart illustrating a reliability verification read according to example embodiments of the inventive concept.

FIG. 5 is a flow chart illustrating the reliability verification read S1030 according to example embodiments of the inventive concept. Referring to FIGS. 1 through 5, a count may be increased (incremented) in Step S1110. For example, the count may be increased, when the read operation is performed based on the second address ADDR2 and the second command CMD2 received from an external host device (in step S1020). The counter 125 may increase the count, whenever the read operation is performed.

In step S1120, it is examined whether the count reaches the random number RDN. For example, the memory controller 120 may examine whether the count of the counter 125 reaches the random number RDN generated by the random number generator 123.

If the count does not reach the random number RDN, the reliability verification read may not be performed. If the count reaches the random number RDN, the reliability verification read may be performed in Step S1130. For example, if the count reaches the random number RDN, the memory controller 120 may perform the reliability verification read, based on a read address (e.g., ADDR1 or ADDR2) associated with the read operation causing the increase of the count. If the reliability verification read is finished, the counter 125 may initialize (e.g., reset) the count, in Step S1140. Further, if the reliability verification read is finished, the random number generator 123 may be operated in such a way that a new value is assigned to the random number RDN.

Figure 6:
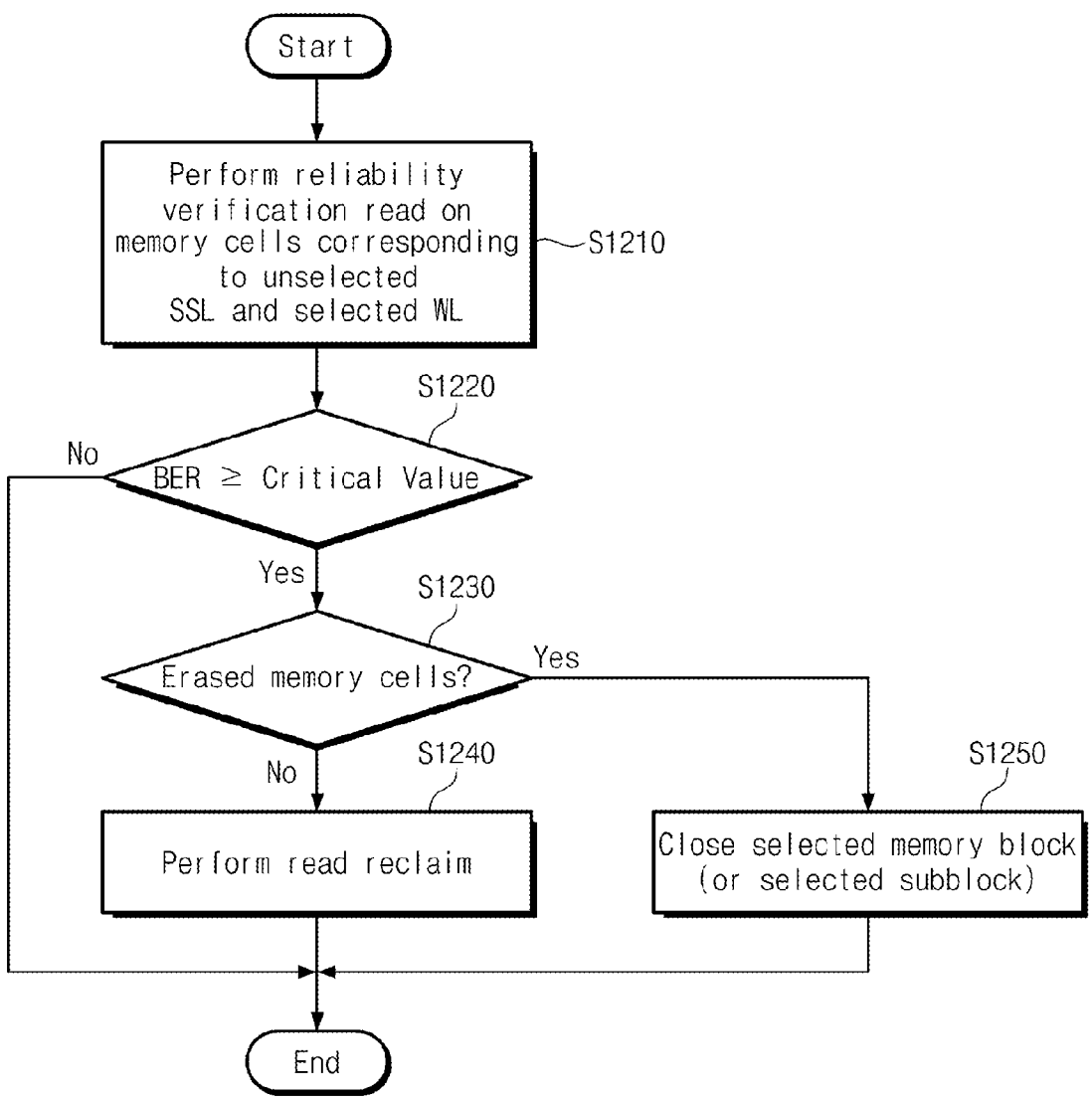
FIG. 6 is a flow chart illustrating a first example of the reliability verification read.

FIG. 6 is a flow chart illustrating a first example of the reliability verification read. Referring to FIGS. 1, 3, and 6, the reliability verification read may be performed on memory cells, which are included in the selected memory block or the selected sub block and are coupled to the unselected string selection line SSL and the selected word line WL, in Step S1210.

As an example, the first row (i.e., the first string selection lines SSL1a and SSL1b) of the memory block BLKa may be selected by a request from the external host. In addition, the second word line WL2 of the memory block BLKa may be selected. In this case, a read operation may be performed on selected memory cells, which are included in the memory block BLKa and are coupled to the first string selection lines SSL1a and SSL1b and the second word line WL2.

During the read operation, the count may reach the random number RDN. The reliability verification read may be performed, based on the address of the selected memory cells, on which the read operation was performed. For example, the reliability verification read may be performed on memory cells, which are coupled to the unselected second string selection lines SSL2a and SSL2b and the selected second word line WL2. Hereinafter, memory cells, on which the reliability verification read has been performed, will be called "verified memory cells".

In Step S1220, a bit error rate of the data read out by the reliability verification read may be examined. For example, the error correction block 127 may correct an error of the data read out by the reliability verification read and examine the bit error rate thereof.

For example, the MSB page data may be read out from the verified memory cells, and a bit error rate of the MSB page data may be examined. The LSB page data, the CSB page data, and the MSB page data may be read out from the verified memory cells, and a bit error rate of at least one of the plurality of page data (e.g., at least MSB page data) may be examined. The examination of the bit error rate may be performed on page data having the highest bit error rate, among a plurality of page data stored in the verified memory cells.

If the bit error rate is lower than a critical value, it may represent that the read disturbance on the verified memory cells is within a tolerable range. In this case, it is possible to omit subsequent steps of the reliability verification read.

If the bit error rate is higher than or equal to the critical value, it may represent that the read disturbance on the verified memory cells is beyond the tolerable range. In this case, the subsequent steps of the reliability verification read may be performed. For example, in Step S1230, it is examined whether the verified memory cells are erased cells, from which data have been erased.

If the verified memory cells are not the erased cells, it represents that specific data are stored in the verified memory cells. If the bit error rate of the data read out from the verified memory cells is higher than or equal to the critical value, a read reclaim may be performed, in Step S1240. For example, data, which are stored in the verified memory cells or a group of memory cells including the same, may be copied or moved to other group of memory cells, which do not include the verified memory cells. Here, the groups of memory cells may be selected to be an erase unit (e.g., a memory block or a sub block).

In example embodiments, the erased cells may be memory cells that are in an erase state or are in the lowest range of possible threshold voltage distribution ranges. Accordingly, the read disturbance may lead to a larger effect on the erased cells than on memory cells containing data. Even in the case that a bit error rate of the erased cells is higher than the critical value, a bit error rate of memory cells containing data may not be higher than the critical value. Accordingly, if the verified memory cells are the erased cells, the read reclaim may not be omitted and the selected memory block BLKa or the selected sub block may be closed. For example, the selected memory block BLKa or the selected sub block may be prevented from being additionally programmed; that is, it may be set to a read-only state. If the selected memory block BLKa or the selected sub block is closed, the closed state may be maintained until the selected memory block BLKa or the selected sub block is erased or is set as an invalid block.

In example embodiments, if the selected memory block BLKa or the selected sub block is closed, data of the memory cells coupled to the selected string selection line SSL1 and the selected word line WL2 may be copied or moved to another memory block or another sub block. In other words, data of the selected memory cells may be copied or moved.

The reliability verification read may be performed, for example, whenever the read operations are performed a predetermined number of times. The more frequently the memory cells are selected during the read operation, the more likely they cause the reliability verification read. In other words, memory cells, which are selected in a read operation causing the reliability verification read, may be most responsible for the read disturbance, which may occur in the selected memory block BLKa or the selected sub block. In this sense, in the case where data of the selected memory cells are copied or moved to another memory block or another sub block, it is possible to reduce a possibility of the read disturbance in the selected memory block BLKa or the selected sub block. Accordingly, an additional read disturbance can be prevented from occurring in the closed memory block BLKa or the closed sub block, and this makes it possible to reduce the iteration number of the read reclaim.

Figure 7:
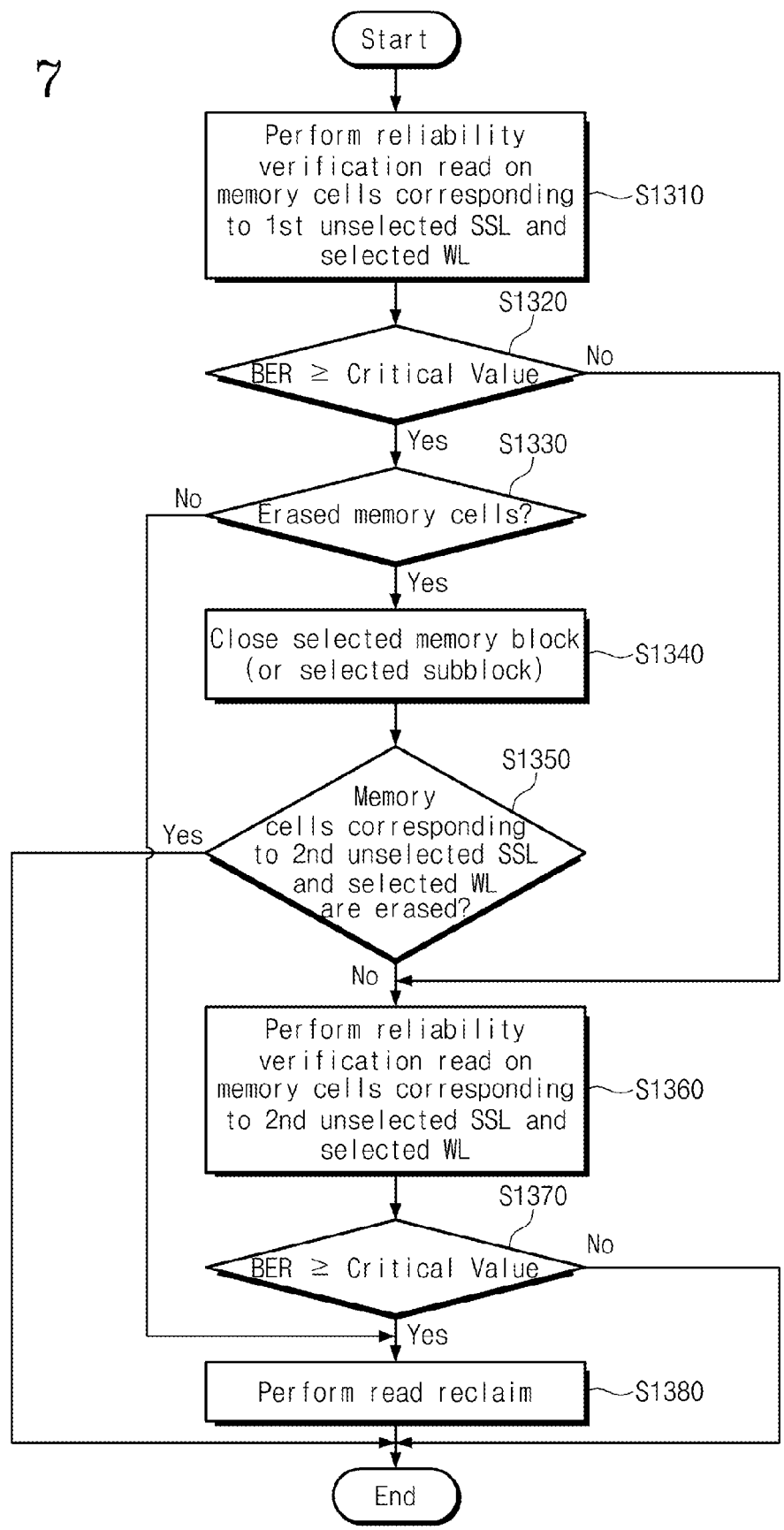
FIG. 7 is a flow chart illustrating a second example of the reliability verification read.

FIG. 7 is a flow chart illustrating a second example of the reliability verification read. Referring to FIGS. 1, 3, and 7, the reliability verification read may be performed on memory cells, which are included in the selected memory block or the selected sub block and are coupled to a first unselected string selection line SSL and a selected word line WL, in Step S1310.

As an example, during the read operation, the first string selection lines SSL1a and SSL1b and the second word line WL2 may be selected. In Step S1310, the reliability verification read may be performed on memory cells (e.g., first verified memory cells) corresponding to the second string selection lines SSL2a and SSL2b and the second word line WL.

In Step S1320, it is examined whether a bit error rate of the data read out from the first verified memory cells is higher than or equal to a critical value. If the bit error rate of the first verified memory cells is lower than the critical value, a step S1360 may be performed. If the bit error rate of the first verified memory cells is higher than or equal to the critical value, subsequent steps may be performed on the first verified memory cells.

In Step S1330, it is examined whether the first verified memory cells are erased cells. If the first verified memory cells are not the erased cells, the read reclaim may be performed. For example, data, which are stored in an erase unit (e.g., a memory block or a sub block) including the first verified memory cells (or in the first verified memory cells), may be copied or moved to other erase unit (or other read/write unit). If the read reclaim is completed, steps related to the reliability verification read may be terminated.

If the first verified memory cells are the erased cells, the selected memory block BLKa or the selected sub block may be closed, in Step S1340. Thereafter, Step S1350 may be performed.

In Step S1350, it is examined whether memory cells (e.g., second verified memory cells) corresponding to the second unselected string selection line SSL and the selected word line WL are the erased cells. Although not illustrated in FIG. 3 for the sake of brevity, it is examined whether second verified memory cells corresponding to third string selection lines SSL3a and SSL3b and the second word line WL2 are the erased cells.

Since the selected memory block BLKa or the selected sub block has been closed in Step S1340, subsequent steps on the second verified memory cells may be omitted, when the second verified memory cells are the erased cells.

In the case where the second verified memory cells are not the erased cells, the reliability verification read may be performed on the second verified memory cells, in Step S1360. In Step S1370, it is examined whether a bit error rate of the second verified memory cells is higher than or equal to a critical value. If the bit error rate of the second verified memory cells is lower than the critical value, subsequent steps may be omitted. If the bit error rate of the second verified memory cells is higher than or equal to the critical value, the read reclaim may be performed on the selected memory block BLKa or the selected sub block, in Step S1380.

In summary, unselected memory cells, which share the selected word line WL with the selected memory cells and corresponds to unselected string selection lines SSL, are examined. If a bit error rate of the verified memory cells are equal to or greater than the critical value and the unselected memory cells are erased memory cells, the memory block or sub block including the verified memory cells is closed. If the bit error rate of the verified memory cells are equal to or greater than the critical value and at least a portion of the verified memory cells are not erased cells (i.e., programmed memory cells), data stored in the memory block or sub block (or the verified memory cells) are reclaimed.

Figure 8:
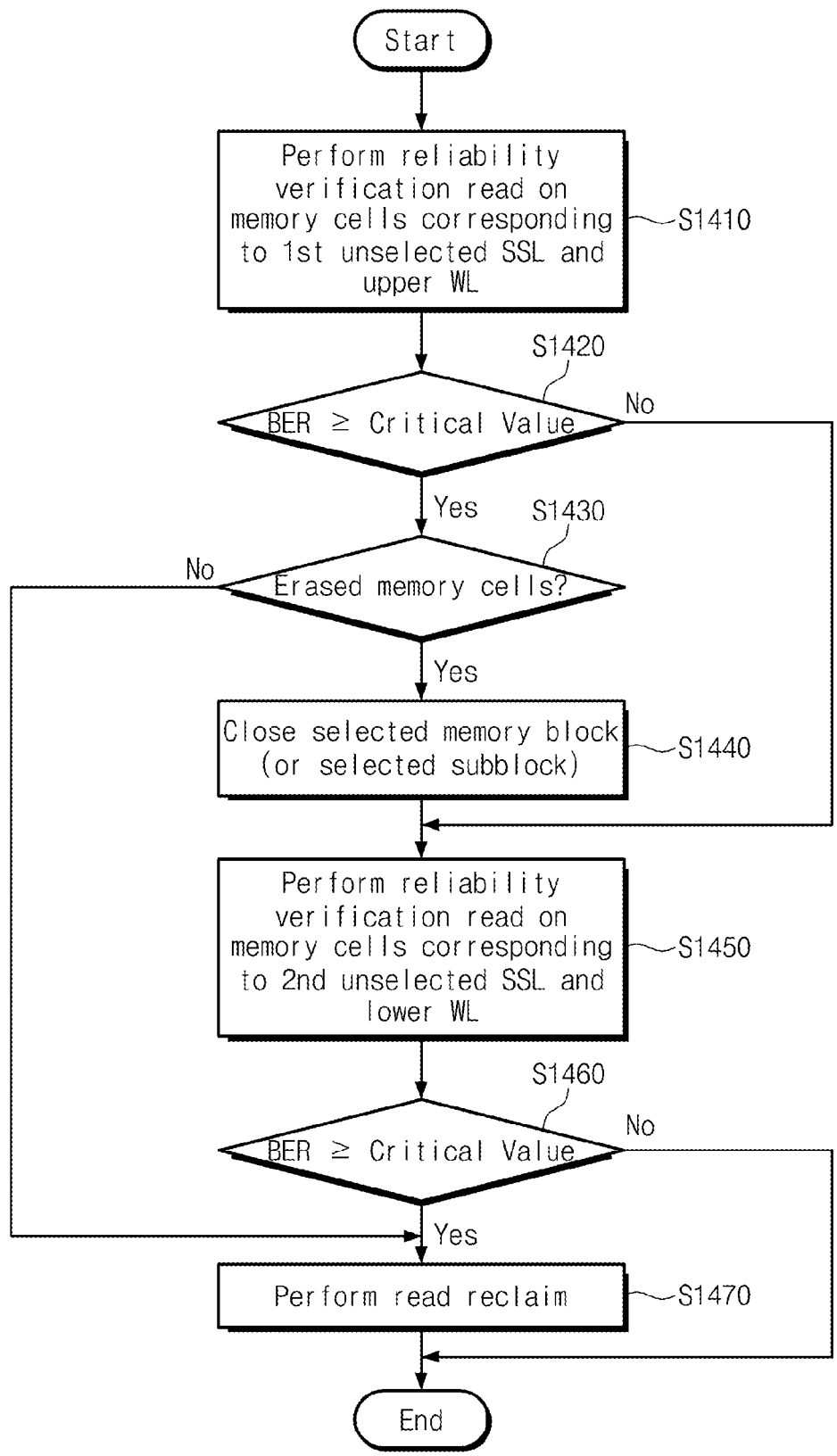
FIG. 8 is a flow chart illustrating a third example of the reliability verification read.

FIG. 8 is a flow chart illustrating a third example of the reliability verification read. Referring to FIGS. 1, 3, and 8, the reliability verification read may be performed on memory cells, which are included in the selected memory block or the selected sub block and are coupled to an unselected string selection line SSL and an upper word line WL positioned above the selected word line WL, in Step S1410.

As an example, during the read operation, the first string selection lines SSL1a and SSL1b and the second word line WL2 may be selected. In Step S1410, the reliability verification read may be performed on memory cells (e.g., first verified memory cells) corresponding to the second string selection lines SSL2a and SSL2b and a third word line WL3 positioned above (i.e., at a higher level than) the second word line WL2.

In Step S1420, a bit error rate of the first verified memory cells may be compared with a critical value. If the bit error rate of the first verified memory cells is lower than the critical value, Step S1450 may be performed.

If the bit error rate of the first verified memory cells is higher than or equal to the critical value, it is examined whether the first verified memory cells are the erased cells, in Step S1430. If the first verified memory cells are not the erased cells, the read reclaim may be performed in Step S1470, and subsequent steps may be terminated. If the first verified memory cells are not the erased cells, the selected memory block BLKa or the selected sub block may be closed, in Step S1440. Thereafter, step S1450 may be performed.

In Step S1450, the reliability verification read may be performed on memory cells, which are included in the selected memory block or the selected sub block and correspond to the unselected string selection line SSL and a lower word line WL positioned below the selected word line WL.

As an example, in Step S1450, the reliability verification read may be performed on memory cells (e.g., the second verified memory cells), which are coupled to the second string selection lines SSL2a and SSL2b and the first word line WL1 positioned below (i.e., at a lower level than) the second word line WL2.

In Step S1460, a bit error rate of the second verified memory cells may be compared with a critical value. If the bit error rate of the second verified memory cells is lower than the critical value, subsequent steps may not be performed. If the bit error rate of the second verified memory cells is higher than or equal to the critical value, the read reclaim may be performed on the selected memory block BKLa or the selected sub block, in Step S1470.

As an example, in the memory block BLKa, the data programming may be performed in an order from the memory cells adjacent to the ground selection transistors GSTa and GSTb to the memory cells adjacent to the string selection transistors SSTa and SSTb. In other words, the data programming may be performed in an order from memory cells connected to the first word line WL1 to memory cells connected to the sixth word line WL6.

In the case where the read operation is performed through the second word line WL2, memory cells connected to the second word line WL2 may be in a programmed state. Accordingly, memory cells, which are connected to the third word line WL3 positioned above the second word line WL2, may be in an erased state, but memory cells, which are connected to the first word line WL1 positioned below the second word line WL2, may not be in the erased state. Thus, when the reliability verification read is performed on the second verified memory cells coupled to the lower word line (e.g., WL1), a step (e.g., S1350 of FIG. 7) of examining whether the second verified memory cells are the erased cells may be omitted. However, example embodiments of the inventive concept are not limited thereto. For example, a step of examining whether the second verified memory cells are the erased cells may be performed, before the reliability verification read is performed on the second verified memory cells (e.g., coupled to the lower word line (e.g., WL2)) of the selected memory block BLKa, according to a program or read sequence.

As an example, in the case where the operation of programming data in the memory cells is not performed based on a specific order, an additional step may be performed to examine whether the second verified memory cells are the erased cells. Further, in the case where it is possible to read the erased cells in a normal read operation, not in the reliability verification read, the additional step may be performed to examine whether the second verified memory cells are the erased cells.

Figure 9:
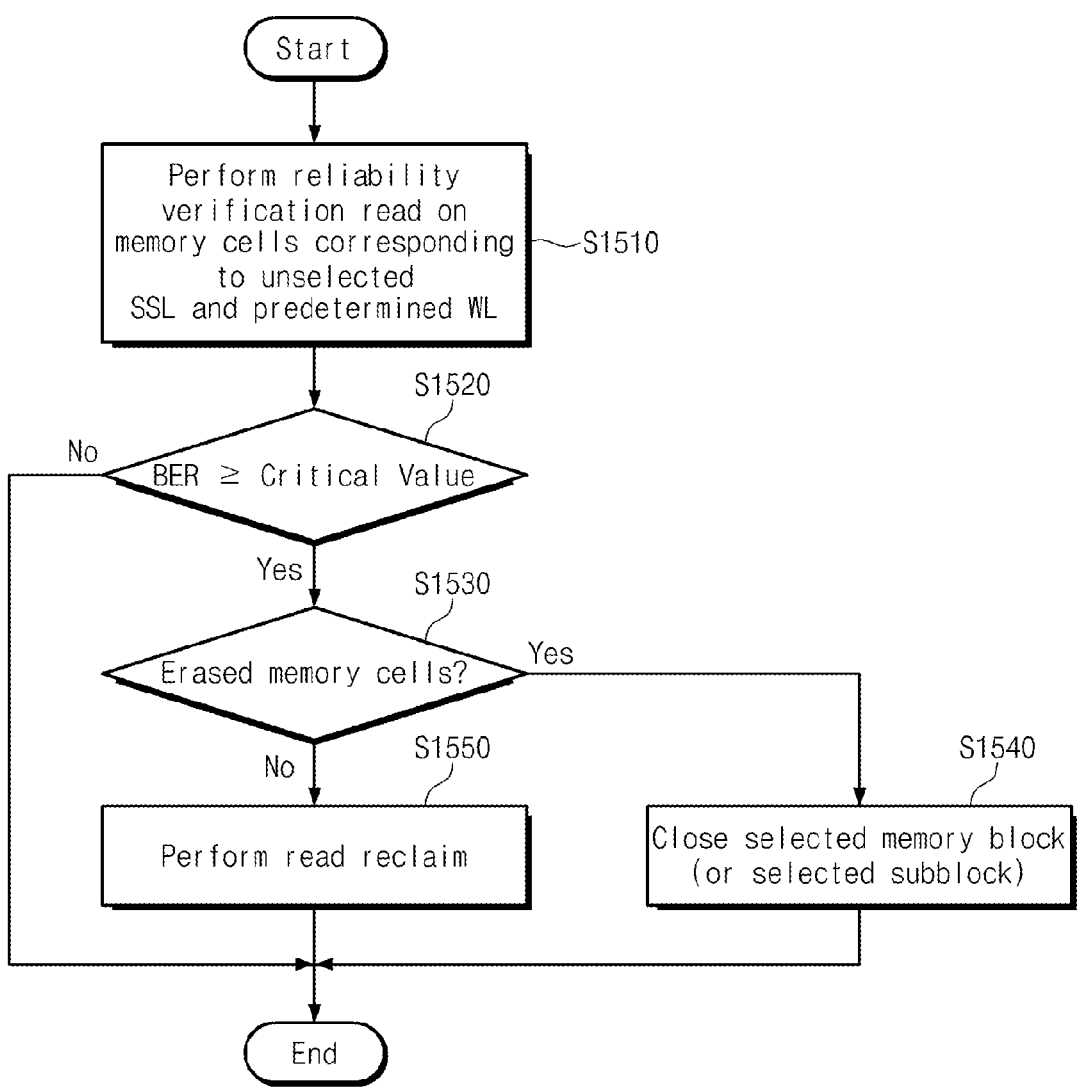
FIG. 9 is a flow chart illustrating a fourth example of the reliability verification read.

FIG. 9 is a flow chart illustrating a fourth example of the reliability verification read. Referring to FIGS. 1, 3, and 9, the reliability verification read may be performed on memory cells, which are included in the selected memory block or the selected sub block and are coupled to an unselected string selection line SSL and a predetermined word line WL, in Step S1510.

As an example, during the read operation, the first string selection lines SSL1a and SSL1b and the second word line WL2 may be selected. In this case, the reliability verification read may be performed on memory cells (e.g., verified memory cells) coupled to the second string selection lines SSL2a and SSL2b and at least one predetermined one (e.g., WL4) of the first to sixth word lines WL1-WL6, in Step S1410.

Due to process variations that may occur during fabrication of the memory block BLKa, memory cells (e.g., bad cells) at a specific level may have a deteriorated data storing property, compared with that of memory cells at different levels. The memory controller 120 may be operated in such a way that the reliability verification read is performed on memory cells (not limited to the bad cells) of a word line which coupled with the bad cells. In example embodiments, the bad cells may be specified by a test to be performed after the fabrication of the non-volatile memory 110 and may be stored in the non-volatile memory 110 or in a non-volatile memory (e.g., ROM) of the memory controller 120. The memory controller 120 may perform the reliability verification read, based on information on the stored positions of the bad cells.

In Step S1520, a bit error rate of the verified memory cells may be compared with a critical value. If the bit error rate of the verified memory cells is lower than the critical value, subsequent steps may be terminated. If the bit error rate of the verified memory cells is higher than or equal to the critical value, it is examined whether the verified memory cells are the erased cells, in Step S1530.

If the verified memory cells are the erased cells, the selected memory block BLKa or the selected sub block may be closed, in Step S1540. If the verified memory cells are not the erased cells, the read reclaim may be performed on the selected memory block BLKa or the selected sub block, in Step S1550.

In an embodiment, the reliability verification read may be performed at least twice on the memory cells of the word line coupled with the bad cells.

Figure 10:
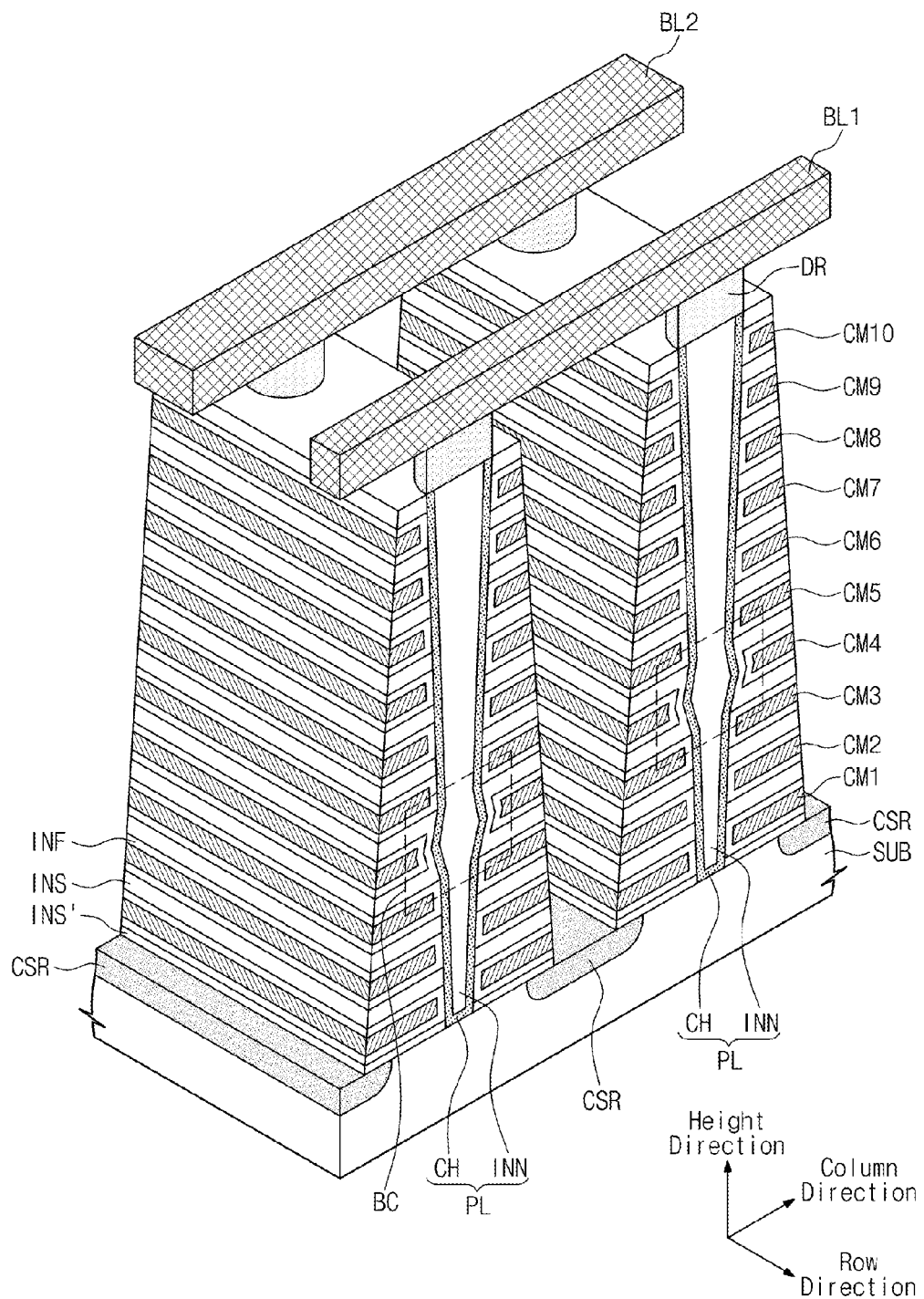
FIG. 10 is a perspective view exemplarily illustrating a structure of the memory block of FIG. 3.

Hereinafter, an example of formation of bad cells will be described with reference to FIG. 10. FIG. 10 is a perspective view exemplarily illustrating a structure of the memory block BLKa of FIG. 3. Referring to FIGS. 3 and 10, common source regions CSR may be provided in a substrate SUB. The common source regions CSR may extend in a row direction and be spaced apart from each other in a column direction. The common source regions CSR may be connected to each other to constitute a common source line CSL. The substrate SUB may include a p-type semiconductor material, and the common source regions CSR may include an n-type semiconductor material.

A plurality of insulating layers INS and INS' may be provided on the substrate SUB between the common source regions CSR. The insulating layers INS and INS' may be sequentially stacked spaced apart from each other in a height direction (e.g., normal to a top surface of the substrate SUB). For example, the insulating layers INS and INS' may include an insulating material (e.g., semiconductor oxides or semiconductor nitrides). In example embodiments, the insulating layer INS' may be in contact with the top surface of the substrate SUB and may be formed to have a thickness smaller than that of each of the others (e.g., the insulating layers INS).

A plurality of pillars PL may be provided between the common source regions CSR. The pillars PL may be arranged spaced apart from each other in the row and column directions and penetrate the insulating layers INS and INS' in the height direction. In example embodiments, the pillars PL may be in contact with the substrate SUB through the insulating layers INS and INS'. Each of the pillars PL may include a channel layer CH and an internal layer INN. The channel layer CH may include a p-type or intrinsic semiconductor material. The internal layer INN may include an insulating material or an air gap. In certain embodiments, each of the pillars PL may further include at least one insulating layer that is provided to cover an outer surface of the channel layer CH and is formed of an oxide or nitride layer (e.g., of silicon oxide or silicon nitride).

Information storing layers INF may be provided to cover top and bottom surfaces of the insulating layers INS and INS' and exposed outer surfaces of the pillars PL. The information storing layers INF may be provided to expose a top surface of the highest one of the insulating layers INS and INS'. The information storing layers INF may include a charge-trap layer, which electric charges can be trapped in or discharged from. For example, each of the information storing layers INF may include a semiconductor nitride layer or a semiconductor oxide layer. In certain embodiments, each of the information storing layers INF may be provided to have an oxide-nitride-oxide (ONO) or oxide-nitride-aluminum (ONA) structure.

Conductive materials CM1-CM10 may be sequentially stacked on the substrate SUB between the common source regions CSR. The conductive materials CM1-CM10 may be spaced apart from each other in the height direction to face the exposed outer surfaces of the information storing layers INF between the insulating layers INS and INS'. The conductive materials CM1-CM10 may include a metallic conductive material.

A plurality of drains DR may be provided on the pillars PL, respectively. In example embodiments, each of the drains DR may include an n-type semiconductor material (e.g., n-type silicon pattern). The drains DR may be in contact with top surfaces of the channel layers CH of the pillars PL, respectively.

Bit lines BL1 and BL2 may be provided on the drains DR. The bit lines BL1 and BL2 may extend parallel to the column direction and may be spaced apart from each other in the row direction. Each of the bit lines BL1 and BL2 may be connected to a plurality of the drains DR. In certain embodiments, the bit lines BL1 and BL2 may be respectively connected to the drains DR through contact plugs interposed therebetween. The bit lines BL1 and BL2 may include a metallic conductive material.

The pillars PL, in conjunction with the information storing layers INF and the conductive materials CM1-CM10, may constitute a plurality of cell strings CS11, CS12, CS21, and CS22. For example, each cell string may include one of the pillars PL, the information storing layers INF adjacent thereto, and the conductive materials CM1-CM10 adjacent thereto.

In example embodiments, the first and second conductive materials CM1 and CM2 may serve as control gates of the ground selection transistors GSTa and GSTb, respectively. Portions of the information storing layers INF facing the first and second conductive materials CM1 and CM2 may serve as charge-trap layers of the ground selection transistors GSTa and GSTb, respectively. Portions of the channel layers CH facing the first and second conductive materials CM1 and CM2 may serve as vertical bodies of the ground selection transistors GSTa and GSTb, respectively. In certain embodiments, the first and second conductive materials CM1 and CM2 may be electrically connected to each other to serve as a single ground selection line GSL.

The third to eighth conductive materials CM3-CM8 may serve as control gates of the first to sixth memory cells MC1-MC6, respectively. Portions of the information storing layers INF facing the third to eighth conductive materials CM3-CM8 may serve as charge-trap layers of the first to sixth memory cells MC1-MC6, respectively. Portions of the channel layers CH facing the third to eighth conductive materials CM3-CM8 may serve as vertical bodies of the first to sixth memory cells MC1-MC6, respectively.

The third conductive materials CM3 at the same level in the height direction may be electrically connected to each other to serve as a first word line WL1. The fourth conductive materials CM4 at the same level in the height direction may be electrically connected to each other to serve as a second word line WL2. The fifth conductive materials CM5 at the same level in the height direction may be electrically connected to each other to serve as a third word line WL3. The sixth conductive materials CM6 at the same level in the height direction may be electrically connected to each other to serve as a fourth word line WL4. The seventh conductive materials CM7 at the same level in the height direction may be electrically connected to each other to serve as a fifth word line WL5. The eighth conductive materials CM8 at the same level in the height direction may be electrically connected to each other to serve as a sixth word line WL6.

The ninth and tenth conductive materials CM9 and CM10 may serve as control gates of the string selection transistors SSTa and SSTb, respectively. Portions of the information storing layers INF facing the ninth and tenth conductive materials CM9 and CM10 may serve as charge-trap layers of the string selection transistors SSTa and SSTb, respectively. Portions of the channel layers CH facing the ninth and tenth conductive materials CM9 and CM10 may serve as vertical bodies of the string selection transistors SSTa and SSTb, respectively.

The ninth conductive material CM9 at a first row may serve as the string selection line SSL1$a$, and the tenth conductive material CM10 at the first row may serve as the string selection line SSL1$b$. The ninth conductive material CM9 at a second row may serve as the string selection line SSL2$a$, and the tenth conductive material CM10 at the second row may serve as the string selection line SSL2$b$.

As shown in FIG. 10, due to an etching property in a fabrication process, each of the pillars PL may be formed to have a width that decreases in a direction toward the substrate SUB. However, a process anomaly may occur such that the width of the pillar PL may not decrease continuously. For example, as depicted in a portion BC of FIG. 10, the width of the pillar PL may decrease, increase, and decrease in the direction toward the substrate SUB. The memory cells positioned near the portion BC of FIG. 10 may have a deteriorated electric property (e.g., data-storing property), compared with that of other normal memory cells. For example, the memory cells positioned near the portion BC of FIG. 10 may be classified as the "bad cells".

According to example embodiments of the inventive concept, positions of the bad cells may be examined, and then, the reliability verification read may be performed on the bad cells.

Figure 11:
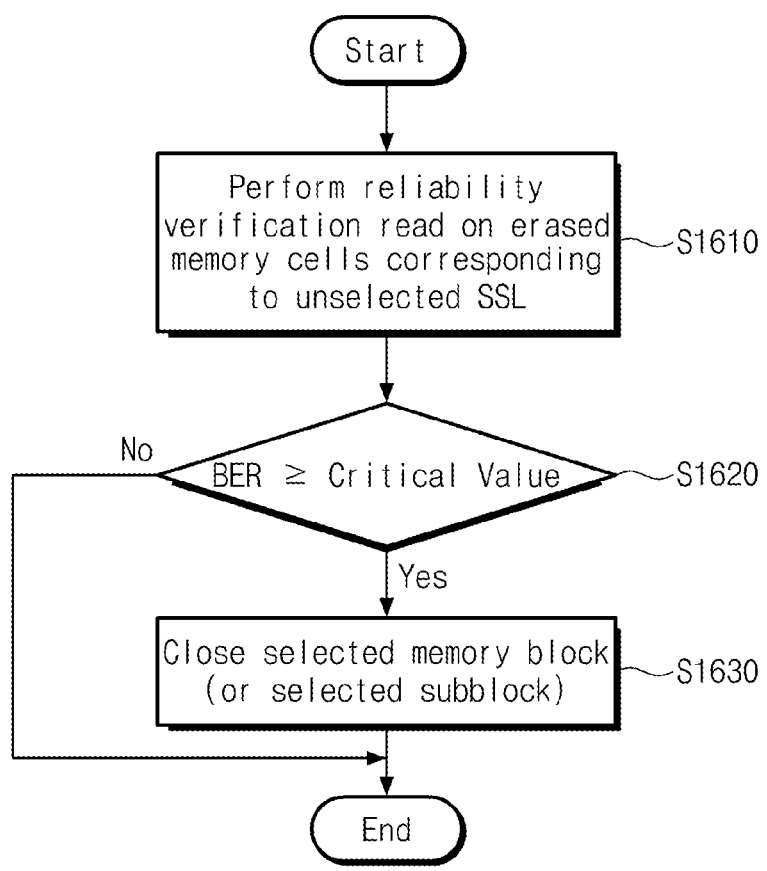
FIG. 11 is a flow chart illustrating a fifth example of the reliability verification read.

FIG. 11 is a flow chart illustrating a fifth example of the reliability verification read. Referring to FIGS. 1, 3, and 11, the reliability verification read may be performed on erased cells, which are included in selected memory block or selected sub block and are coupled to an unselected string selection line SSL, in Step S1610.

As an example, during the read operation, the first string selection lines SSL1$a$ and SSL1$b$ and the second word line WL2 may be selected. In Step S1610, the reliability verification read may be performed on at least one row, which consists of erased cells of the memory cells corresponding to the second string selection lines SSL2$a$ and SSL2$b$.

In Step S1620, it is examined whether the bit error rate of the erased cells is higher than or equal to a critical value. That is, it is examined whether the number of memory cells having threshold voltages higher than a predetermined voltage is higher than or equal to the critical value. If the bit error rate of the erased cells is higher than or equal to the critical value, the selected memory block BLKa or the selected sub block may be closed.

As an example, the reliability verification read of FIG. 11 may be performed, when at least one row consisting of the erased cells exists in the selected memory block BLKa or the selected sub block.

Figure 12:
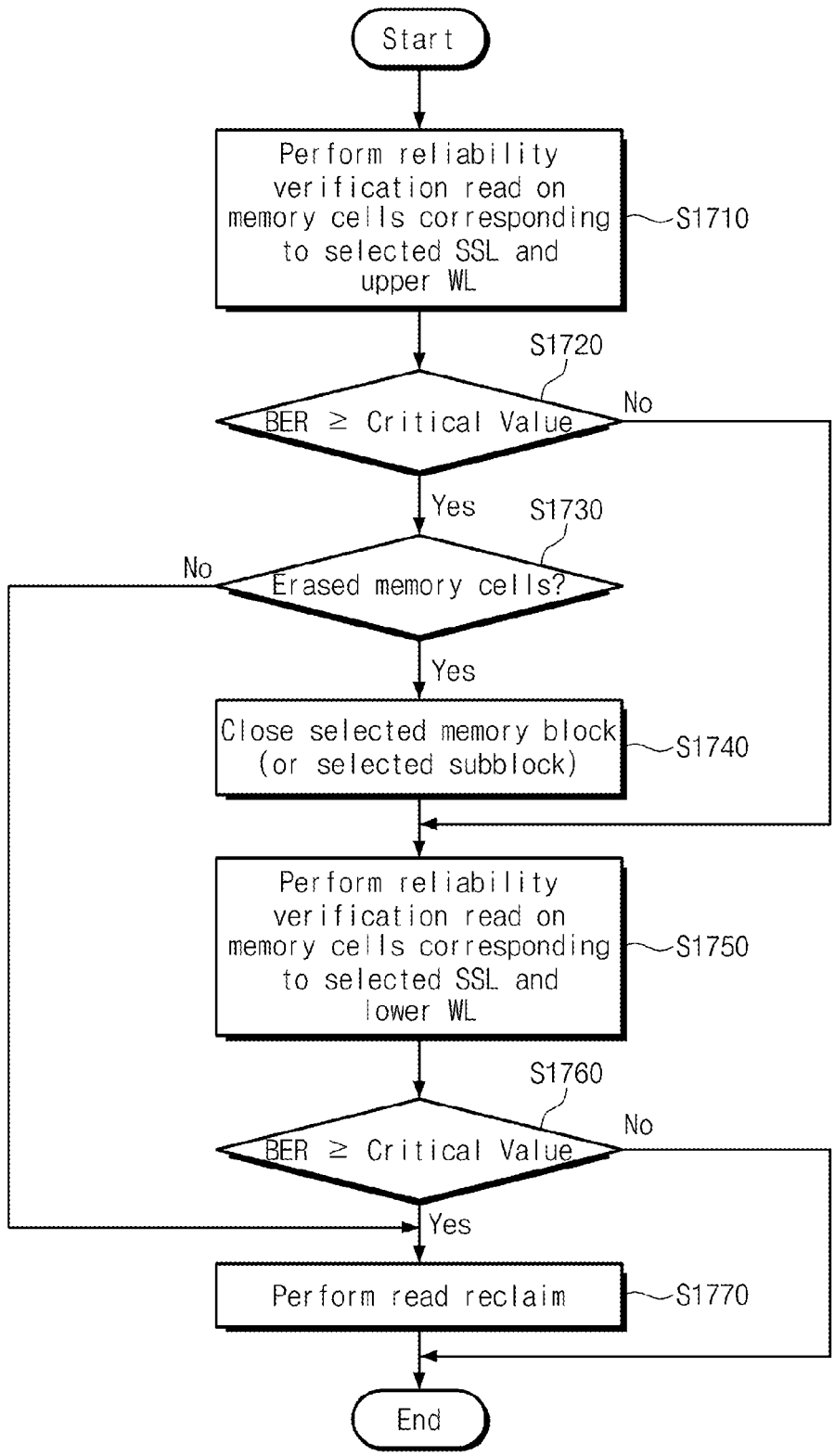
FIG. 12 is a flow chart illustrating a sixth example of the reliability verification read.

FIG. 12 is a flow chart illustrating a sixth example of the reliability verification read. Referring to FIGS. 1, 3, and 12, the reliability verification read may be performed on memory cells, which are included in selected memory block or selected sub block and are coupled to a selected string selection line SSL and an upper word line WL positioned above a selected word line WL, in Step S1710.

As an example, during the read operation, the first string selection lines SSL1a and SSL1b and the second word line WL2 may be selected. In this case, the reliability verification read may be performed on memory cells (e.g., the first verified memory cells) corresponding to the first string selection lines SSL1a and SSL1b and the third word line WL3 positioned above (i.e., at a higher level than) the second word line WL2, in Step S1710.

In Step S1720, a bit error rate of the first verified memory cells may be compared with a critical value. If the bit error rate of the first verified memory cells is lower than the critical value, a step S1750 may be performed.

If the bit error rate of the first verified memory cells is higher than or equal to the critical value, it is examined whether the first verified memory cells are the erased cells, in Step S1730. If the first verified memory cells are not the erased cells, the read reclaim may be performed in Step S1770 and subsequent steps may not be performed. If the first verified memory cells are the erased cells, the selected memory block BLKa or the selected sub block may be closed, in Step S1740. Thereafter, step S1750 may be performed.

In Step S1750, the reliability verification read may be performed on memory cells, which are included in the selected memory block or the selected sub block and correspond to the selected string selection line SSL and a lower word line WL positioned below the selected word line WL.

As an example, in Step S1750, the reliability verification read may be performed on memory cells (e.g., the second verified memory cells), which are coupled to the first string selection lines SSL1a and SSL1b and the first word line WL1 positioned below (i.e., at a lower level than) the second word line WL2.

In Step S1760, a bit error rate of the second verified memory cells may be compared with a critical value. If the bit error rate of the second verified memory cells is lower than the critical value, subsequent steps may not be performed. If the bit error rate of the first verified memory cells is higher than or equal to the critical value, the read reclaim may be performed on the selected memory block BKLa or the selected sub block, in Step S1770.

In summary, unselected memory cells, which shares the selected string selection line SSL with the selected memory cells and corresponds to upper and/or lower word lines WL, are examined. If a bit error rate of the verified memory cells are equal to or greater than the critical value and the unselected memory cells are erased memory cells, the memory block or sub block including the verified memory cells is closed. If the bit error rate of the verified memory cells are equal to or greater than the critical value and at least a portion of the verified memory cells are not erased cells (i.e., programmed memory cells), data stored in the memory block or sub block (or the verified memory cells) are reclaimed.

Figure 13:
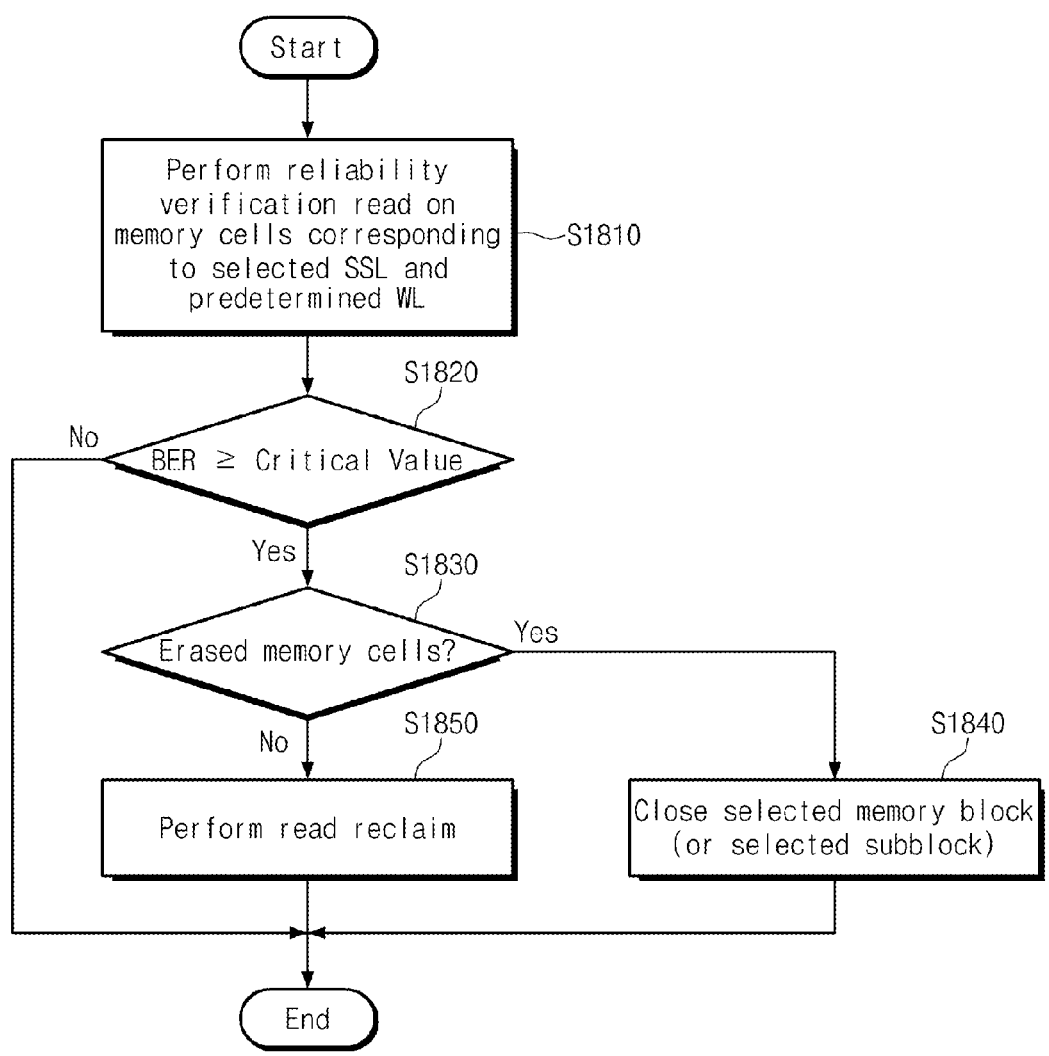
FIG. 13 is a flow chart illustrating a seventh example of the reliability verification read.

FIG. 13 is a flow chart illustrating a seventh example of the reliability verification read. Referring to FIGS. 1, 3, and 13, the reliability verification read may be performed on memory cells, which are included in the selected memory block or the selected sub block and are coupled to a selected string selection line SSL and a predetermined word line WL, in Step S1810.

As an example, during the read operation, the first string selection lines SSL1a and SSL1b and the second word line WL2 may be selected. In this case, the reliability verification read may be performed on memory cells (e.g., verified memory cells), which are coupled to the second string selection lines SSL2a and SSL2b and at least predetermined one (e.g., WL4) of the first to sixth word lines WL1-WL6, in Step S1810.

In Step S1820, a bit error rate of the verified memory cells may be compared with a critical value. If the bit error rate of the verified memory cells is lower than the critical value, subsequent steps may not be performed. If the bit error rate of the verified memory cells is higher than or equal to the critical value, it is examined whether the verified memory cells are the erased cells, in Step S1730.

If the verified memory cells are the erased cells, the selected memory block BLKa or the selected sub block may be closed, in Step S1740. If the verified memory cells are not the erased cells, the read reclaim may be performed on the selected memory block BKLa or the selected sub block, in Step S1750.

Figure 14:
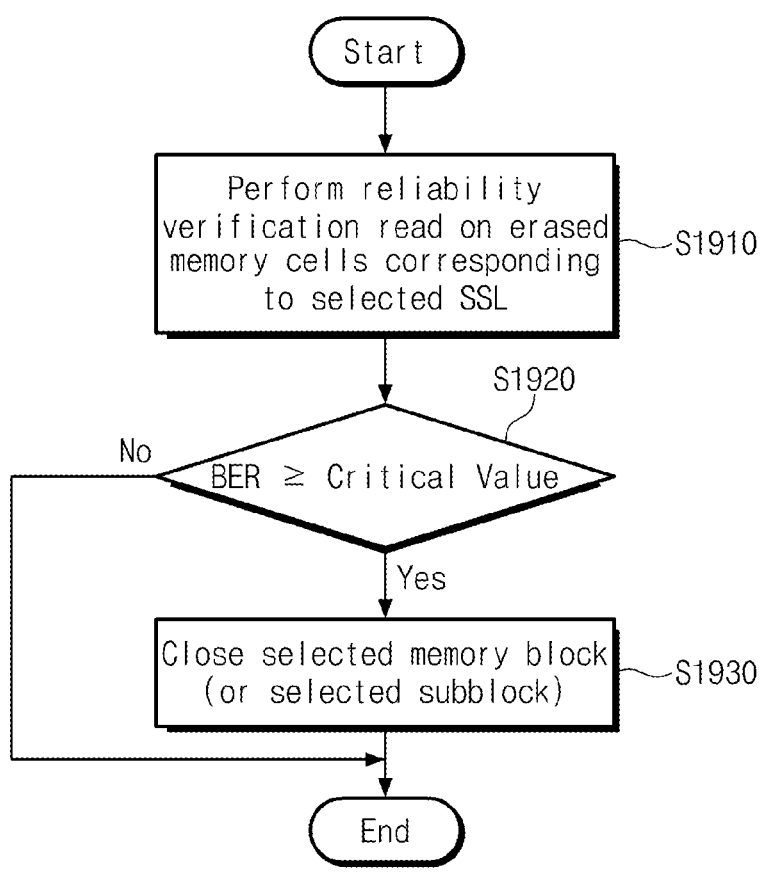
FIG. 14 is a flow chart illustrating an eighth example of the reliability verification read.

FIG. 14 is a flow chart illustrating an eighth example of the reliability verification read. Referring to FIGS. 1, 3, and 14, the reliability verification read may be performed on erased cells, which are included in the selected memory block or the selected sub block and are coupled to an unselected string selection line SSL, in Step S1910.

As an example, during the read operation, the first string selection lines SSL1a and SSL1b and the second word line WL2 may be selected. In this case, the reliability verification read may be performed on at least one row consisting of erased cells of the memory cells corresponding to the first string selection lines SSL1a and SSL1b, in Step S1910.

In Step S1920, it is examined whether the bit error rate of the erased cells is higher than or equal to the critical value. If the bit error rate of the erased cells is higher than or equal to the critical value, the selected memory block BLKa or the selected sub block may be closed.

As an example, the reliability verification read of FIG. 14 may be performed, when the selected memory block BLKa or the selected sub block includes at least one row consisting of erased cells.

Figure 15:
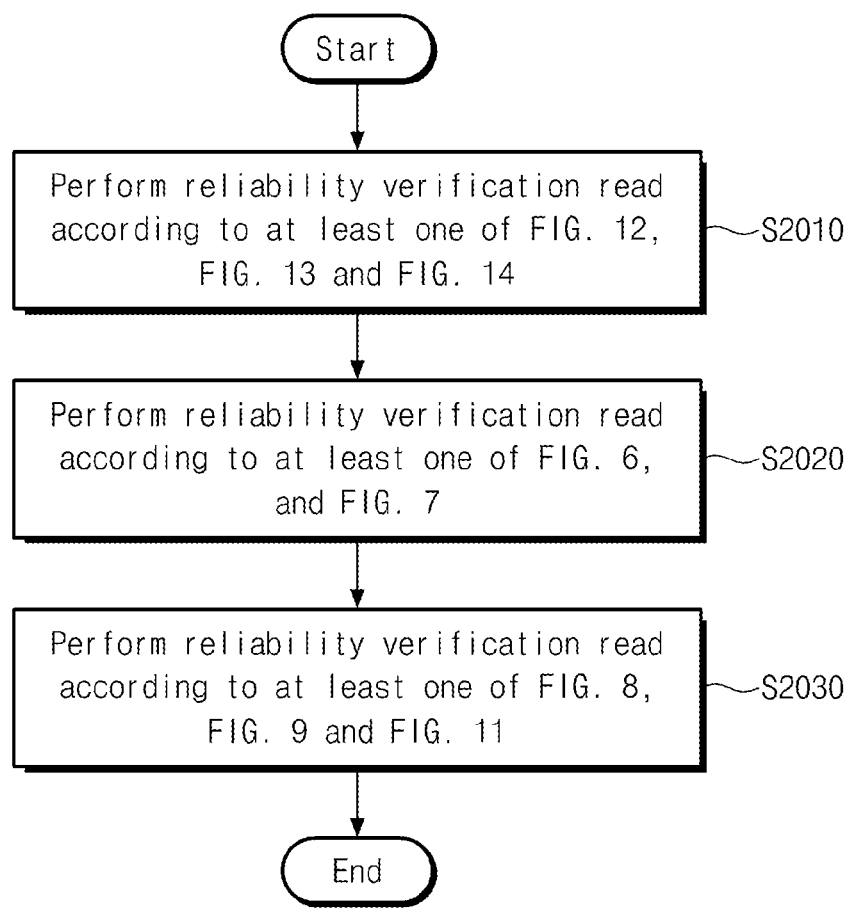
FIG. 15 is a flow chart illustrating a ninth example of the reliability verification read.

FIG. 15 is a flow chart illustrating a ninth example of the reliability verification read. Referring to FIGS. 1, 3, and 15, the reliability verification read may be performed in the same or similar manner as at least one of the methods described with reference to FIGS. 12, 13, and 14, in Step S2010. For example, the reliability verification read may include at least one of the afore-described reliability verification reads, which are performed on memory cells corresponding to a selected string selection line SSL and an upper word line WL positioned above a selected word line WL, on memory cells corresponding to a selected string selection line SSL and a lower word line WL positioned below the selected word line WL, on memory cells corresponding to a selected string selection line SSL and a predetermined word line WL, or on a row of erased cells included in memory cells corresponding to a selected string selection line SSL.

In Step S2020, the reliability verification read may be performed in the same or similar manner as at least one of the methods described with reference to FIGS. 6 and 7. For example, the reliability verification read may be performed on memory cells corresponding at least one unselected row and a selected word line WL.

In Step S2030, the reliability verification read may be performed in the same or similar manner as at least one of the methods described with reference to FIGS. 8, 9 and 11. For example, the reliability verification read may include at least one of the afore-described reliability verification reads, which are performed on memory cells corresponding to an unselected string selection line SSL and an upper word line WL positioned above a selected word line WL, on memory cells corresponding to an unselected string selection line SSL and a lower word line WL positioned below a selected word line WL, on memory cells corresponding to an unselected string selection line SSL and a predetermined word line WL, or on a row of erased cells included in memory cells corresponding to an unselected string selection line SSL.

In other words, the reliability verification read may be performed on memory cells, which are positioned adjacent to the selected memory cells, to which the read operation has been performed, on memory cells, which are included in the same erase unit as the selected memory cells and are located at predetermined positions, or on erased cells included in the same erase unit as the selected memory cells. The reliability verification read may be performed on one or at least two rows. In the case where a bit error rate of the verified memory cells (e.g., except for the erased cells) is higher than or equal to a critical value, the read reclaim may be performed or scheduled for further operation. In the read reclaim, data, which are stored in an erase unit (e.g., the memory block BLKa or the sub block) including the verified memory cells, may be copied or moved to other erase unit. If the read reclaim is performed, subsequent steps associated with the reliability verification read may be omitted. If a bit error rate of the erased cells is higher than or equal to a critical value, the selected memory block BLKa or the selected sub block may be closed. When the selected memory block BLKa or the selected sub block is closed, the reliability verification read on the erased cells may be omitted.

Figure 16:
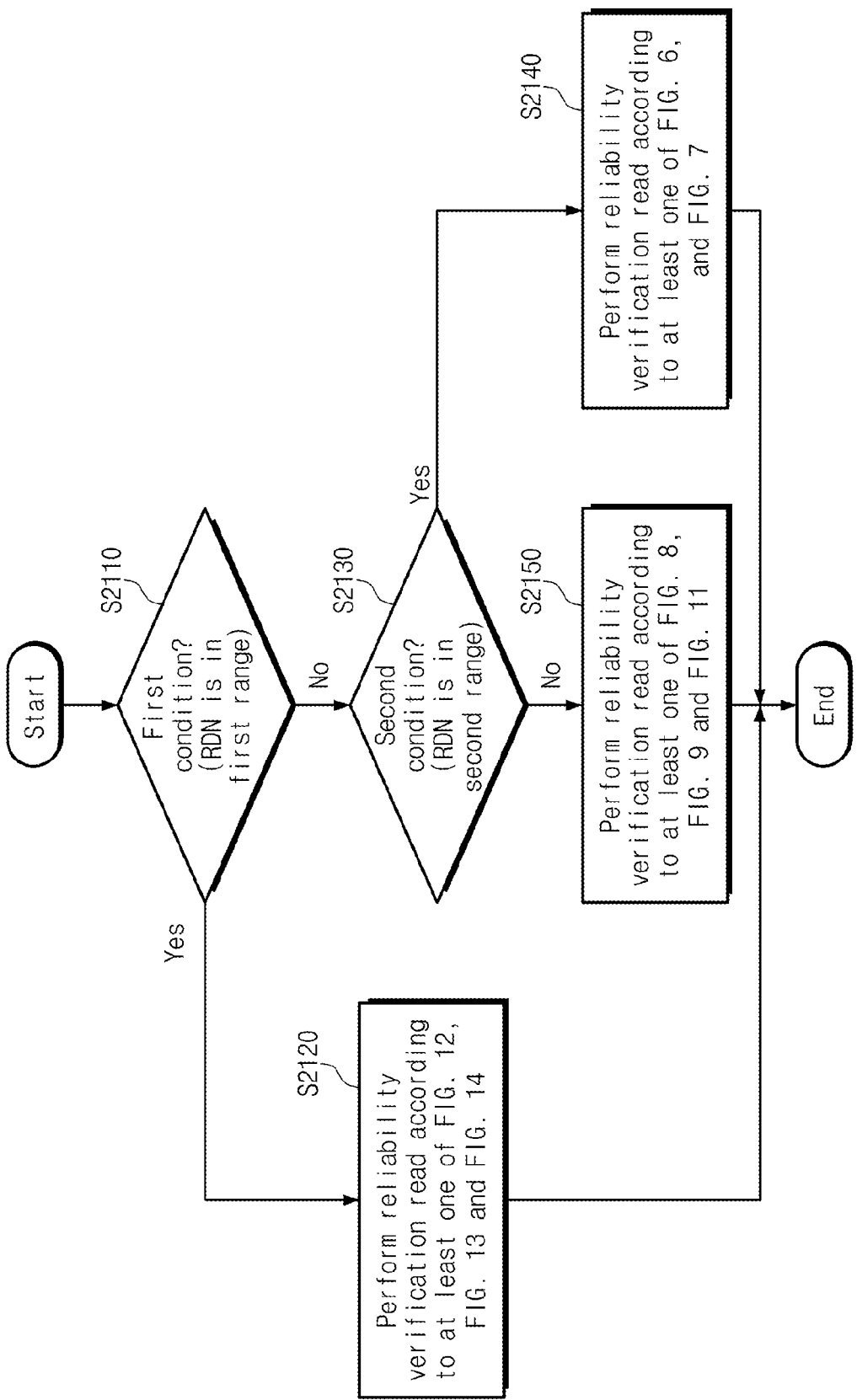
FIG. 16 is a flow chart illustrating a tenth example of the reliability verification read.

FIG. 16 is a flow chart illustrating a tenth example of the reliability verification read. Referring to FIGS. 1, 3, and 16, it is examined whether a first condition is satisfied, in Step S2120. For example, it may be examined whether the random number RDN is within a first range, in Step S2110. If the first condition is satisfied, the reliability verification read may be performed in the same or similar manner as at least one of the methods described with reference to FIGS. 12, 13, and 14.

If the first condition is not satisfied, it is examined whether a second condition is satisfied, in Step S2130. For example, it may be examined whether the random number RDN is within a second range. If the second condition is satisfied, the reliability verification read may be performed in the same or similar manner as at least one of the methods described with reference to FIGS. 6 and 7, in Step S2140. If the second condition is not satisfied, the reliability verification read may be performed in the same or similar manner as at least one of the methods described with reference to FIGS. 8, 9 and 11.

In other words, the memory controller 120 may be configured to select verified memory cells, on which the reliability verification read will be performed, depending on a given situation.

Figure 17:
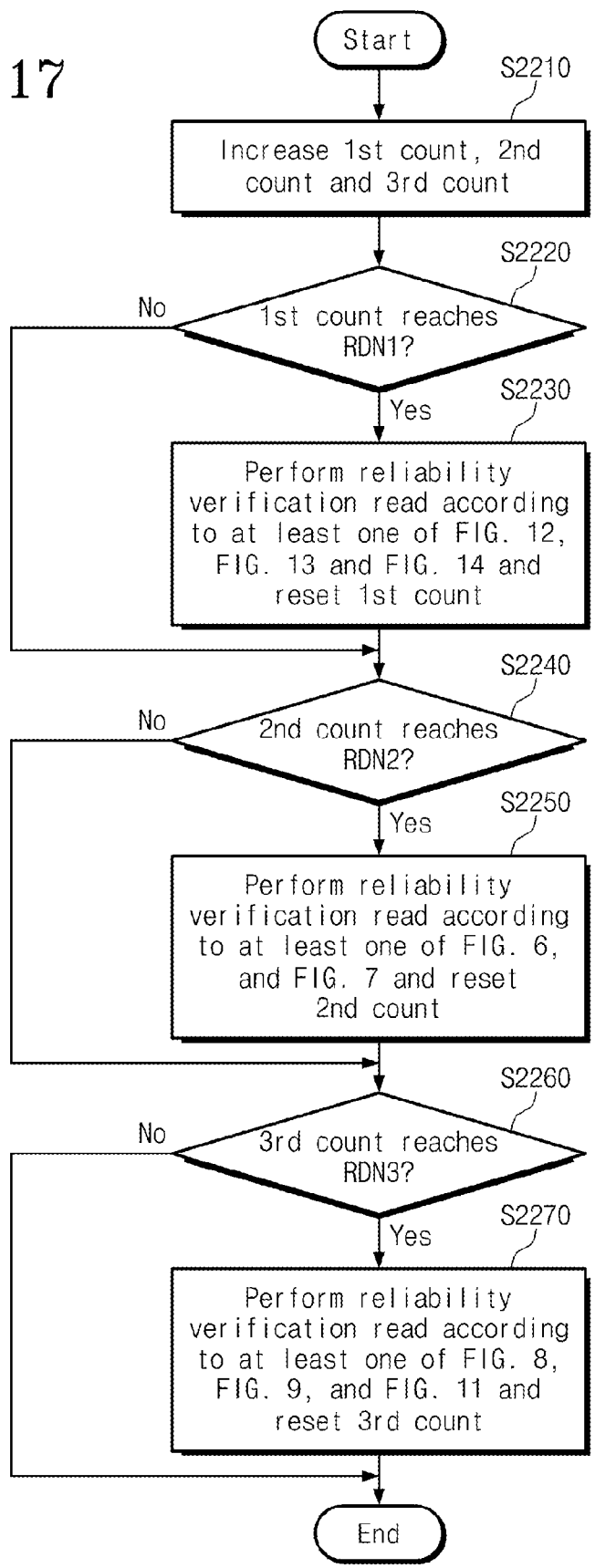
FIG. 17 is a flow chart illustrating an eleventh example of the reliability verification read.

FIG. 17 is a flow chart illustrating an eleventh example of the reliability verification read. Referring to FIGS. 1, 3, and 17, the random number generator 123 may generate a plurality of random numbers. For example, the random number generator 123 may generate first to third random numbers RDN1, RDN2, and RDN3. The counter 125 may manage a plurality of counts corresponding to the plurality of random numbers. For example, the counter 125 may manage first to third counts corresponding to the first to third random numbers RDN1, RDN2, and RDN3, respectively.

If a read operation is performed on memory cells in the selected memory block BLKa or the selected sub block, the first to third counts may be respectively increased, in Step S2210.

In Step S2220, it is examined whether the first count reaches the first random number RDN1. If the first count reaches the first random number RDN1, step S2230 may be performed. In Step S2230, the reliability verification read may be performed in the same or similar manner as at least one of the methods described with reference to FIGS. 12, 13, and 14. Further, the first count may be initialized, and the first random number RDN1 may be updated.

In Step S2240, it is examined whether the second count reaches the second random number RDN2. If the second count reaches the second random number RDN2, step S2250 may be performed. In Step S2250, the reliability verification read may be performed in the same or similar manner as at least one of the methods described with reference to FIGS. 6 and 7. Further, the second count may be initialized, and the second random number RDN2 may be updated.

In Step S2260, it is examined whether the third count reaches the third random number RDN3. If the third count reaches the third random number RDN3, step S2270 may be performed. In Step S2270, the reliability verification read may be performed in the same or similar manner as at least one of the methods described with reference to FIGS. 8, 9 and 11. Further, the third count may be initialized, and the third random number RDN3 may be updated.

In other words, the memory controller 120 may manage a plurality of random numbers RDN and a plurality of count corresponding to the plurality of random numbers RDN, respectively. In the memory controller 120, at least one of the afore-described reliability verification reads may be selectively executed, depending on which count reaches the random number RDN corresponding thereto.

In the above examples, the reliability verification read on one memory block BLKa has been exemplarily described. As described with reference to FIG. 2, the non-volatile memory 110 may include the plurality of memory blocks BLK1-BLKz, each of which may be divided into a plurality of sub blocks.

The memory controller 120 may determine a size or region (e.g., a memory block or a sub block) of memory cells, on which the reliability verification read will be performed. In example embodiments, the memory controller 120 may operate in such a way that an erase unit of the non-volatile memory 110 is set as a target region of memory cells, on which the reliability verification read will be performed.

As an example, the random number generator 123 may generate at least one random number RDN for each memory block or each sub block. The counter 125 may manage at least one count for each memory block or each sub block. If an execution condition of the reliability verification read is satisfied in each memory block or each sub block, the reliability verification read may be performed on each memory block or each sub block.

Figure 18:
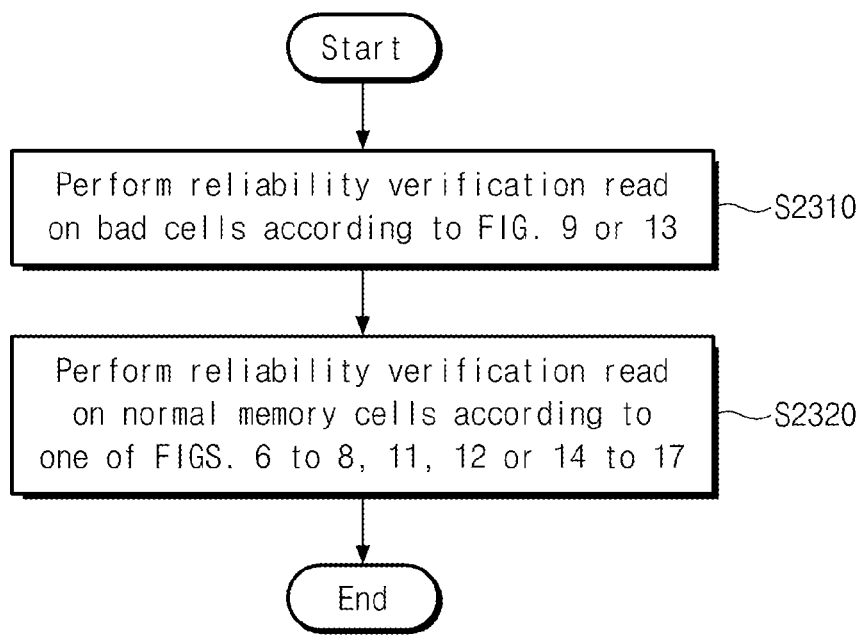
FIG. 18 is a flow chart illustrating a twelfth example of the reliability verification read.

FIG. 18 is a flow chart illustrating a twelfth example of the reliability verification read. Referring to FIGS. 1, 3, and 18, the reliability verification read may be performed on bad cells, using the method described with reference to FIG. 9 or FIG. 13, in Step S2310.

In Step S2320, the reliability verification read may be performed on normal cells, in the same or similar manner as at least one of the method described with reference to FIG. 6 to FIG. 8, FIG. 11, FIG. 12, or FIGS. 14 through 17.

In other words, in the case where there is information on bad cells, the reliability verification read may be firstly performed on the bad cells. The read reclaim may be performed, depending of the result of the reliability verification operation on the bad cells. If the read reclaim is performed, subsequent steps of the reliability verification read may be omitted. In the case where a bit error rate BER of the bad cells is lower than or equal to a critical value, the reliability verification read may be performed on normal cells. The read reclaim may be performed, depending on the result of the reliability verification operation on the normal cells. If the read reclaim is performed, subsequent steps of the reliability verification read may be omitted.

If the verified memory cells are the erased cells, the read reclaim may not be performed and the selected memory block BLKa or the selected sub block may be closed. In the case where the selected memory block BLKa or the selected sub block is closed, the subsequent reliability verification read on the erased cells may be omitted.

Figure 19:
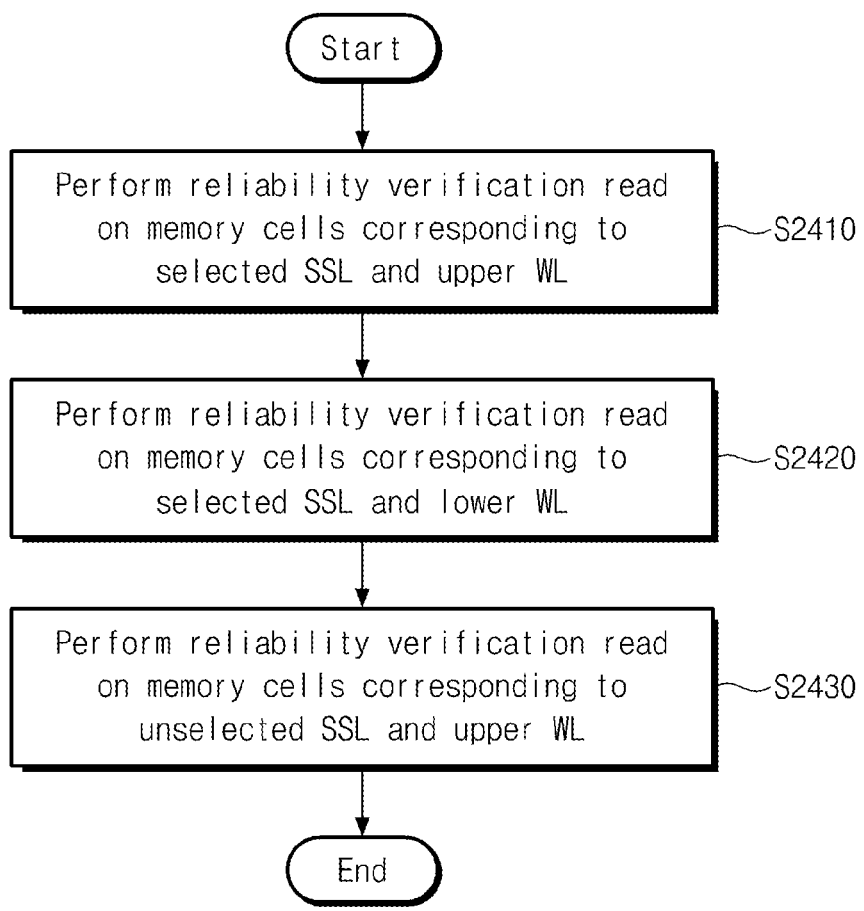
FIG. 19 is a flow chart illustrating a thirteenth example of the reliability verification read.

FIG. 19 is a flow chart illustrating a thirteenth example of the reliability verification read. Referring to FIGS. 1, 3, and 19, the reliability verification read may be performed on memory cells corresponding to a selected string selection line SSL and an upper word line WL, in Step S2410. The reliability verification read may be performed on memory cells corresponding to a selected string selection line SSL and a lower word line WL, in Step S2420. The reliability verification read may be performed on memory cells corresponding to an unselected string selection line WL and the upper word line WL, in Step S2430.

In other words, the reliability verification read may be performed on memory cells corresponding to the upper word line above the selected word line WL i times (where i is a positive integer of 2 or higher), and the reliability verification read may be performed on memory cells corresponding to the lower word line below the selected word line WL j times (where j is a positive integer less than i). For example, the reliability verification read may be respectively performed on i rows of the memory cells corresponding to the upper word line, and the reliability verification read may be performed on j rows of the memory cells corresponding to the lower word line.

If the bit error rate BER of the verified memory cells is higher than or equal to the critical value, the read reclaim may be performed. If the read reclaim is performed, subsequent steps of the reliability verification read may be omitted. If the verified memory cells are the erased cells, the read reclaim may not be performed and the selected memory block BLKa or the selected sub block may be closed. In the case where the selected memory block BLKa or the selected sub block is closed, the subsequent reliability verification read on the erased cells may be omitted.

Figure 20:
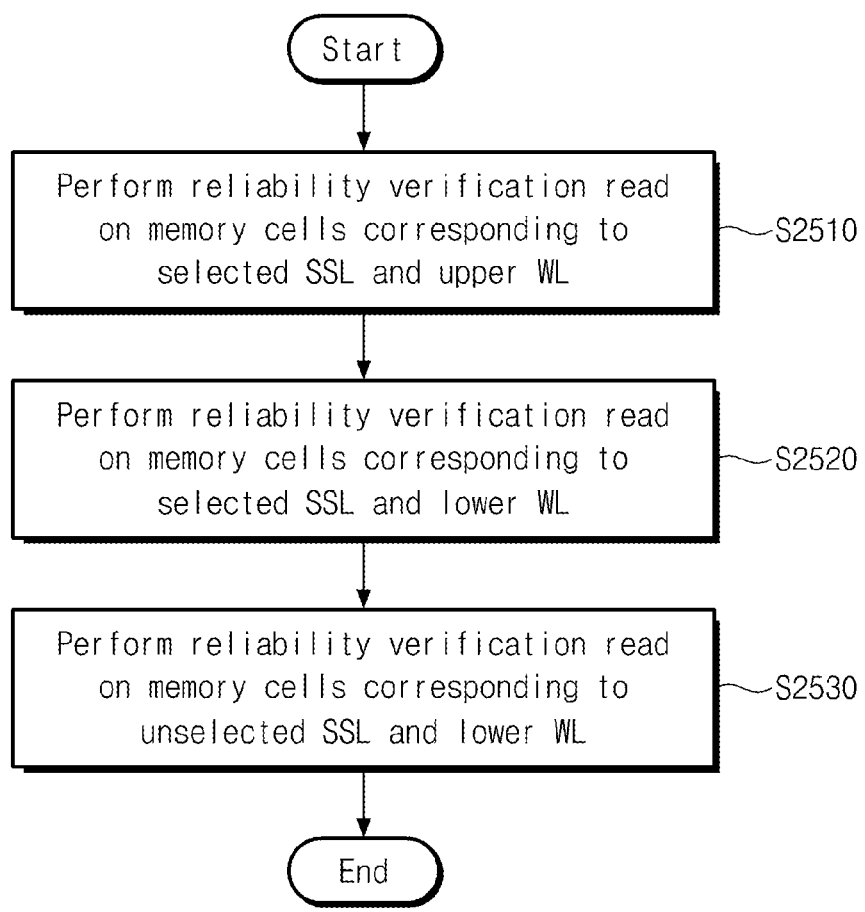
FIG. 20 is a flow chart illustrating a fourteenth example of the reliability verification read.

FIG. 20 is a flow chart illustrating a fourteenth example of the reliability verification read. Referring to FIGS. 1, 3, and 20, the reliability verification read may be performed on memory cells corresponding to a selected string selection line SSL and an upper word line WL, in Step S2510. The reliability verification read may be performed on memory cells corresponding to the selected string selection line SSL and the lower word line WL, in Step S2520. The reliability verification read may be performed on memory cells corresponding to an unselected string selection line WL and a lower word line WL, in Step S2530.

In other words, the reliability verification read may be performed on memory cells corresponding to the lower word line below the selected word line WL i times (where i is a positive integer of 2 or higher), and the reliability verification read may be performed on memory cells corresponding to the upper word line above the selected word line WL j times (where j is a positive integer less than i). For example, the reliability verification read may be respectively performed on i rows of the memory cells corresponding to the lower word line, and the reliability verification read may be performed on j rows of the memory cells corresponding to the upper word line.

If the bit error rate BER of the verified memory cells is higher than or equal to the critical value, the read reclaim may be performed. If the read reclaim is performed, subsequent steps of the reliability verification read may be omitted. If the verified memory cells are the erased cells, the read reclaim may not be performed and the selected memory block BLKa or the selected sub block may be closed. In the case where the selected memory block BLKa or the selected sub block is closed, the subsequent reliability verification read on the erased cells may be omitted.

In an embodiments, the reliability verification reads may performed on first memory cells corresponding to the selected string selection line and located at least one of upper level and lower level of the selected memory cells over the substrate and second memory cells corresponding to the unselected string selection line and located at least one of the upper level and the lower level of the substrate. For example, the reliability verification read may be performed once for the selected string selection line and one of the unselected string selection line, the one being adjacent to the selected string selection line. For example, the reliability verification read may be performed on the first memory cells corresponding to the selected string selection line and located at upper/lower level of the selected memory cell, and the second memory cells corresponding to the unselected string selection line and located at lower/upper level of the selected memory cell.

As described above, according to a read request (or command) from an external host device, the memory controller may perform the reliability verification read plural times. For example, upon reading memory cells according to the read request (or command), the memory controller may perform first reliability verification read and schedule or reserve remaining reliability verification reads. Upon receiving subsequent read request (or command), the memory controller may read memory cells and perform a reliability verification read among the schedule or reserved reliability verification read. That is, the reliability verification reads may be performed alternately with normal reads caused by the read request (or command).

Figure 21:
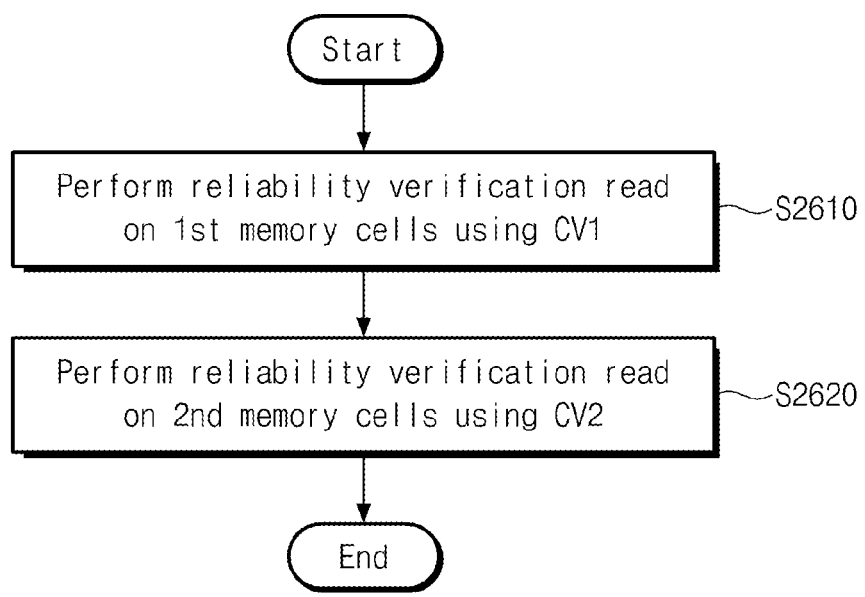
FIG. 21 is a flow chart illustrating a fifteenth example of the reliability verification read.

FIG. 21 is a flow chart illustrating a fifteenth example of the reliability verification read. Referring to FIGS. 1, 3, and 21, a reliability verification read may be performed on first memory cells, using a first critical value CV1, in Step S2610. For example, the first critical value CV1 may be used for comparison with a bit error rate of the first memory cells.

In Step S2620, the reliability verification read may be performed on second memory cells, using a second critical value CV2. For example, the second critical value CV2 may be used for comparison with a bit error rate of the second memory cells. In example embodiments, the second critical value CV2 may be different from the first critical value CV1.

If the bit error rate BER of the verified memory cells is higher than or equal to the critical value, the read reclaim may be performed. If the read reclaim is performed, subsequent steps of the reliability verification read may be omitted. If the verified memory cells are the erased cells, the read reclaim may not be performed and the selected memory block BLKa or the selected sub block may be closed. In the case where the selected memory block BLKa or the selected sub block is closed, the subsequent reliability verification read on the erased cells may be omitted.

As an example, the first memory cells may be the bad cells, and the second memory cells may be the normal cells. In this case, the first critical value CV1 may be set to a value smaller than the second critical value CV2.

As another example, the first memory cells may be the erased cells, and the second memory cells may be the programmed cells. In this case, the first critical value CV1 may be set to a value smaller than the second critical value CV2.

Figure 22:
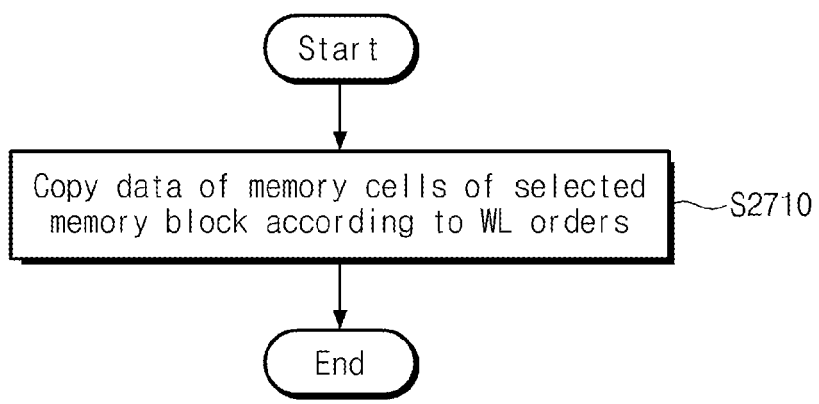
FIG. 22 is a flow chart illustrating a first example of a read reclaim.

FIG. 22 is a flow chart illustrating a first example of the read reclaim. Referring to FIGS. 1, 2, 3, and 22, data of memory cells in the selected memory block BLKa or the selected sub block may be copied or moved to other memory block or other sub block, according to the order of the word lines WL1-WL6, in Step S2710.

As an example, data stored in the memory cells may be copied or moved to other memory block or other sub block, in an order from memory cells connected to the first word line WL1 to memory cells connected to the sixth word line WL6. For example, the memory controller 120 may read out data from the selected memory block BLKa and write the read data into other memory block. For example, once the read reclaim is performed by a unit of the selected memory block BLKa, subsequent processes (e.g., subsequent reliability verification read) related with the reliability verification read may be skipped.

Figure 23:
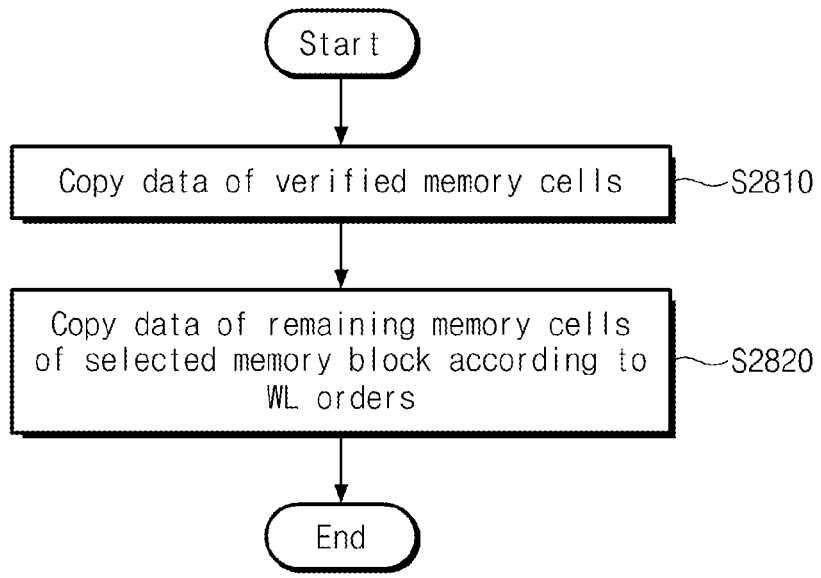
FIG. 23 is a flow chart illustrating a second example of the read reclaim.

FIG. 23 is a flow chart illustrating a second example of the read reclaim. Referring to FIGS. 1, 2, 3, and 23, data of the verified memory cells may be copied or moved, in Step S2810. For example, the memory controller 120 may copy or move data of the verified memory cells, which are included in the selected memory block BLKa or the selected sub block, and on which the verifying read has been performed, to other memory block or other sub block.

In Step S2820, data of remaining memory cells in the selected memory block BLKa or the selected sub block may be copied or moved to other memory block or other sub block, according to the order of the word lines WL1-WL6. For example, the memory controller 120 may read out data from remaining memory cells of the selected memory block BLKa, except for the verified memory cells. The memory controller 120 may write the data of the remaining memory cells read in Step S2820 in a memory block or a sub block, in which the read data of the verified memory cells obtained in Step S2810 are programmed.

As an example, if a bit error rate of the verified memory cells is higher than or equal to a critical value, the read reclaim may be performed. When the read reclaim is performed, the verified memory cells may undergo an additional read disturbance, during an operation of reading out data from the remaining memory cells, other than the verified memory cells. Such an additional read disturbance may lead to an incurable error in the data stored in the verified memory cells. To avoid this phenomenon, data of the verified memory cells, whose bit error rate is examined to be higher than or equal to a critical value, may be read in advance before reading data of the remaining memory cells.

As an example, step S2810 may be immediately performed, when the bit error rate of the verified memory cells is higher than or equal to the critical value. Step S2820 may be performed when the storage device 100 is in an idle state or may be performed as a background operation of the storage device 100. For example, once the read reclaim is performed by a unit of the selected memory block BLKa, subsequent processes (e.g., subsequent reliability verification read) related with the reliability verification read may be skipped.

Figure 24:
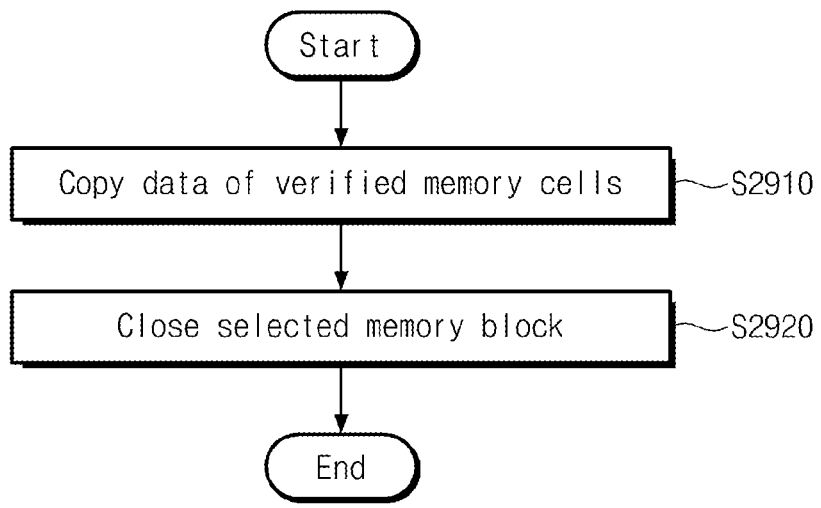
FIG. 24 is a flow chart illustrating a third example of the read reclaim.

FIG. 24 is a flow chart illustrating a third example of the read reclaim. Referring to FIGS. 1, 2, 3, and 24, data of the verified memory cells may be copied or moved to other memory block or other sub block, in Step S2910. In Step S2920, the selected memory block BLKa or the selected sub block may be closed. In other words, when the read reclaim is performed, data of the remaining memory cells, other than the verified memory cells, may not be copied or moved to other memory block or other sub block.

In the case where a target of the read reclaim is limited to the verified memory cells, subsequent steps associated with the reliability verification read may be performed without omission, even in the case of performing the read reclaim. For example, as described with reference to FIGS. 7, 11 and 16, in the case where the read reclaim is performed based on the result of the reliability verification read on the first verified memory cells, the reliability verification read may not be performed on the second verified memory cells. However, if an operation unit for the read reclaim is limited to a row of memory cells, the reliability read operation may be performed on the second verified memory cells, even when the read reclaim is performed based on the result of the reliability verification read on the first verified memory cells.

Figure 25:
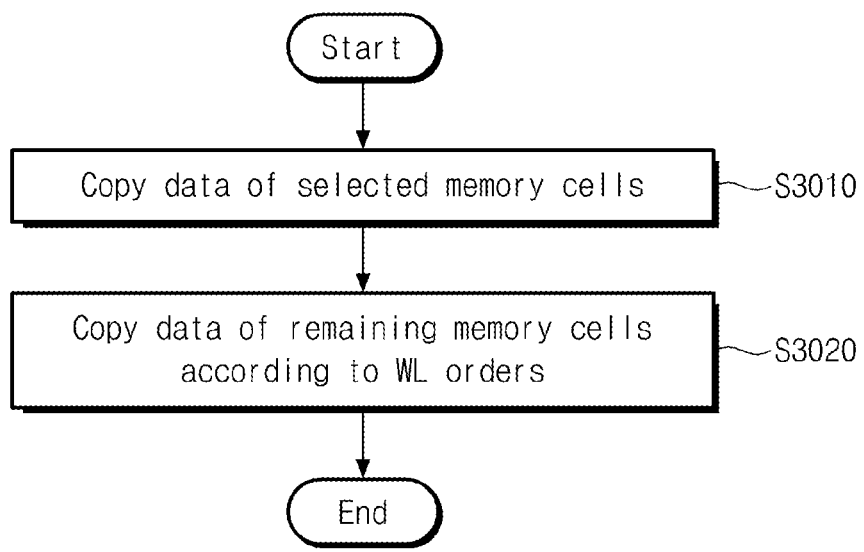
FIG. 25 is a flow chart illustrating a fourth example of the read reclaim.

FIG. 25 is a flow chart illustrating a fourth example of the read reclaim. Referring to FIGS. 1, 2, 3, and 25, in Step S3010, data of the selected memory cells may be copied or moved. For example, the memory controller 120 may copy or move data of memory cells, which are included in the selected memory block BLKa or the selected sub block and to which the read operation was performed by a request from an external host device, to other memory block or other sub block.

In Step S3020, data of remaining memory cells in the selected memory block BLKa or the selected sub block may be copied or moved to other memory block or other sub block, according to the order of the word lines WL1-WL6. For example, the memory controller 120 may read out data from remaining memory cells of the selected memory block BLKa, except for the selected memory cells. The memory controller 120 may write the data of the remaining memory cells read in Step S3020 in a memory block or a sub block, in which the data of the verified memory cells read in Step S3010 are programmed.

As an example, step S3010 may be immediately performed, when the bit error rate of the verified memory cells is higher than or equal to the critical value. Step S3020 may be performed when the storage device 100 is in an idle state or may be performed as a background operation of the storage device 100.

When data stored in the selected memory cells are read, read disturbance may occur in the selected memory block BLKa or the selected sub block. In the case where data of memory cells selected as a target of the read operation are copied or moved to other memory block or other sub block, it is possible to relieve the read disturbance in the selected memory block BLKa or the selected sub block. For example, once the read reclaim is performed by a unit of the selected memory block BLKa, subsequent processes (e.g., subsequent reliability verification read) related with the reliability verification read may be skipped.

Figure 26:
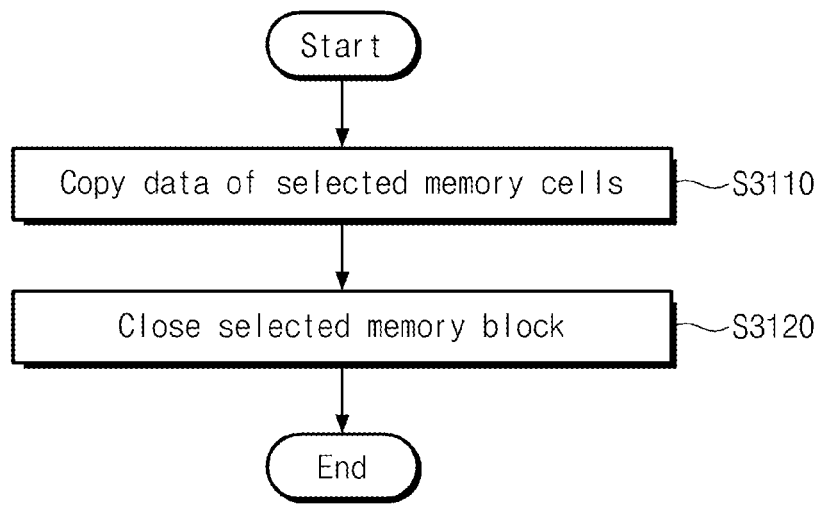
FIG. 26 is a flow chart illustrating a fifth example of the read reclaim.

FIG. 26 is a flow chart illustrating a fifth example of the read reclaim. Referring to FIGS. 1, 2, 3, and 26, in Step S3110, data of the selected memory cells may be copied or moved. For example, the memory controller 120 may copy or move data of memory cells, which are included in the selected memory block BLKa or the selected sub block and to which the read operation was performed by a request from an external host device, to other memory block or other sub block.

In Step S3120, the selected memory block BLKa or the selected sub block may be closed. In other words, when the read reclaim is performed, data of the remaining memory cells, other than the selected memory cells, may not be copied or moved to other memory block or other sub block.

Figure 27:
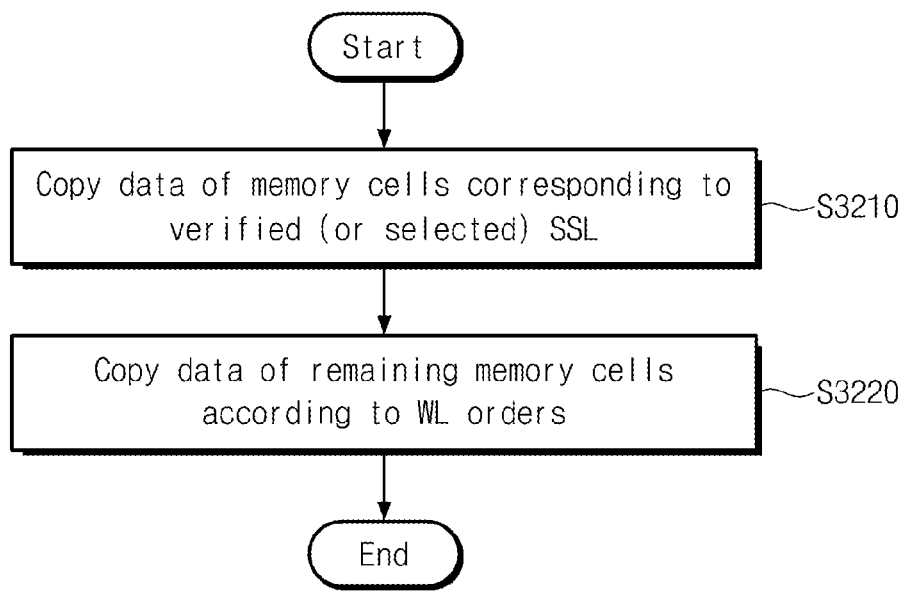
FIG. 27 is a flow chart illustrating a sixth example of the read reclaim.

FIG. 27 is a flow chart illustrating a sixth example of the read reclaim. Referring to FIGS. 1, 2, 3, and 27, in Step S3210, data of memory cells corresponding to a verified or selected string selection line may be copied or moved. For example, if memory cells, whose bit error rate is higher than or equal to a critical value, are found in the reliability verification read, the memory controller 120 may select a string selection line corresponding to such memory cells as a target of the read reclaim.

The memory controller 120 may copy or move data of memory cells (e.g., all relevant memory cells in the selected memory block BLKa or the selected sub block), which are coupled to the string selection line selected as a target of the read reclaim, to other memory block or other sub block.

In Step S3220, data of remaining memory cells in the selected memory block BLKa or the selected sub block may be copied or moved to other memory block or other sub block, according to the order of the word lines WL1-WL6. For example, the memory controller 120 may read out data from the remaining memory cells of the selected memory block BLKa. The memory controller 120 may write the data of the remaining memory cells read in in Step S3220 in a memory block or a sub block, in which the data of the verified memory cells read in Step S3210 are stored.

As an example, step S3210 may be immediately performed, when the bit error rate of the verified memory cells is higher than or equal to the critical value. Step S3220 may be performed when the storage device 100 is in an idle state or may be performed as a background operation of the storage device 100. For example, once the read reclaim is performed by a unit of the selected memory block BLKa, subsequent processes (e.g., subsequent reliability verification read) related with the reliability verification read may be skipped.

Figure 28:
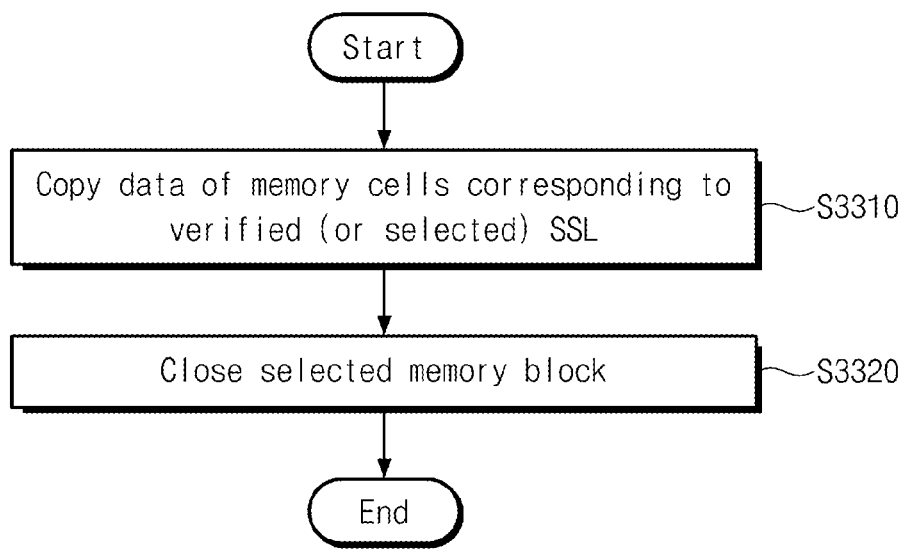
FIG. 28 is a flow chart illustrating a seventh example of the read reclaim.

FIG. 28 is a flow chart illustrating a seventh example of the read reclaim. Referring to FIGS. 1, 2, 3 and 28, in Step S3310, data of memory cells corresponding to a verified or selected string selection line may be copied or moved. For example, if memory cells, whose bit error rate is higher than or equal to a critical value, are found in the reliability verification read, the memory controller 120 may select a string selection line corresponding to such memory cells as a target of the read reclaim.

The memory controller 120 may copy or move data of memory cells (e.g., all relevant memory cells in the selected memory block BLKa or the selected sub block), which are coupled to the string selection line selected as a target of the read reclaim, to other memory block or other sub block.

In Step S3120, the selected memory block BLKa or the selected sub block may be closed. In other words, when the read reclaim is performed, data of the remaining memory cells, which do not corresponding to a string selection line selected for the read reclaim, may not be copied or moved to other memory block or other sub block.

FIG. 29 is a table exemplarily illustrating a method of controlling an operation condition for the reliability verification read. Referring to FIGS. 1, 2, 3, and 29, the memory controller 120 may adjust a condition for the reliability verification read, in consideration of operation status of the storage device 100 or the memory block BLKa.

As an example, the more frequently a program or erase operation is performed on the memory block BLKa or the sub block, the higher an error rate of data stored in the memory block BLKa or the sub block. Accordingly, the memory controller 120 may alter the random number RDN associated with the memory block BLKa or the sub block in such a way that its range or mean value decreases with an increase in an iteration number of the program or erase operations performed on the memory block BLKa or the sub block. Further, in the case where the iteration number of the program or erase operations performed on the memory block BLKa or the sub block increases or is beyond a predetermined value, an additional reliability verification read may be performed, at least once, on at least one row of memory cells in the memory block BLKa or the sub block, under the control of the memory controller 120.

As other example, the more frequently the read operation is performed on the memory block BLKa or the sub block, in which data have been written, the higher an error rate of data stored in the memory block BLKa or the sub block. Accordingly, the memory controller 120 may alter the random number RDN associated with the memory block BLKa or the sub block in such a way that its range or mean value decreases with an increase in an iteration number of the read operations performed on the memory block BLKa or the sub block, in which data have been written. Further, in the case where the iteration number of the read operations performed on the memory block BLKa or the sub block, in which data have been written, increases or is beyond a predetermined value, an additional reliability verification read may be performed, at least once, on at least one row of memory cells in the memory block BLKa or the sub block, under the control of the memory controller 120.

As still other example, as a time that elapses from completion of the data programing on the memory block BLKa or the sub block increases, an error rate of data stored in the memory block BLKa or the sub block increases. Accordingly, the memory controller 120 may alter the random number RDN associated with the memory block BLKa or the sub block in such a way that its range or mean value decreases with an increase in the elapsed time from completion of the data programing on the memory block BLKa or the sub block. Further, in the case where the elapsed time from completion of the data programing on the memory block BLKa or the sub block increases, an additional reliability verification read may be performed, at least once, on at least one row of memory cells in the memory block BLKa or the sub block, under the control of the memory controller 120.

As even other example, the elapsed time from the data programing may be obtained from a program time stamp (PTS), which may be written when the data programing is performed. For example, the program time stamp PTS may denote a time that has elapsed from completion of the data programing. Alternatively, the program time stamp PTS may denote the time when the data programming was performed. In this case, the elapsed time may be obtained by calculating a difference between the program time stamp (PTS) and the current time.

If the elapsed time is very short (for example, shorter than a first reference time), data stored in memory cells of the memory block BLKa or the sub block may have a small chance of error occurrence. Thus, in the memory block BLKa or the sub block, if the elapsed time from the data programing is shorter than the first reference time even when the condition for the reliability verification read is satisfied, the memory controller 120 may omit performing the reliability verification read.

As yet other example, if the elapsed time is too short (for example, shorter than a second reference time that is shorter than the first reference time), data stored in memory cells of the memory block BLKa or the sub block may be in an unstable state, and thus, there is a greater chance of the occurrence of an error. Accordingly, if the elapsed time from the data programing is shorter than the second reference time, the memory controller 120 may further perform the reliability verification read on the memory block BLKa or the sub block at least once.

Depending on whether data of the selected memory cells are random data or sequential data, the memory controller 120 may adjust (i.e., decrease or increase) the iteration number of the reliability verification read to be performed on the memory block BLKa or the sub block.

In the case where there is information on bad cells, but the bad cells are not examined in the reliability verification read, the memory controller 120 may perform the reliability verification read, at least once, on such bad cells, using the method described with reference to FIG. 9 or FIG. 13.

In the case where the selected memory block BLKa or the selected sub block is an open block, the memory controller 120 may control a target of the reliability verification read in such a way that the reliability verification read is not performed on the erased cells. As another example, in the case where the reliability verification read is not performed on the erased cells, the memory controller 120 may perform the reliability verification read on the erased cells at least once.

Figure 30:
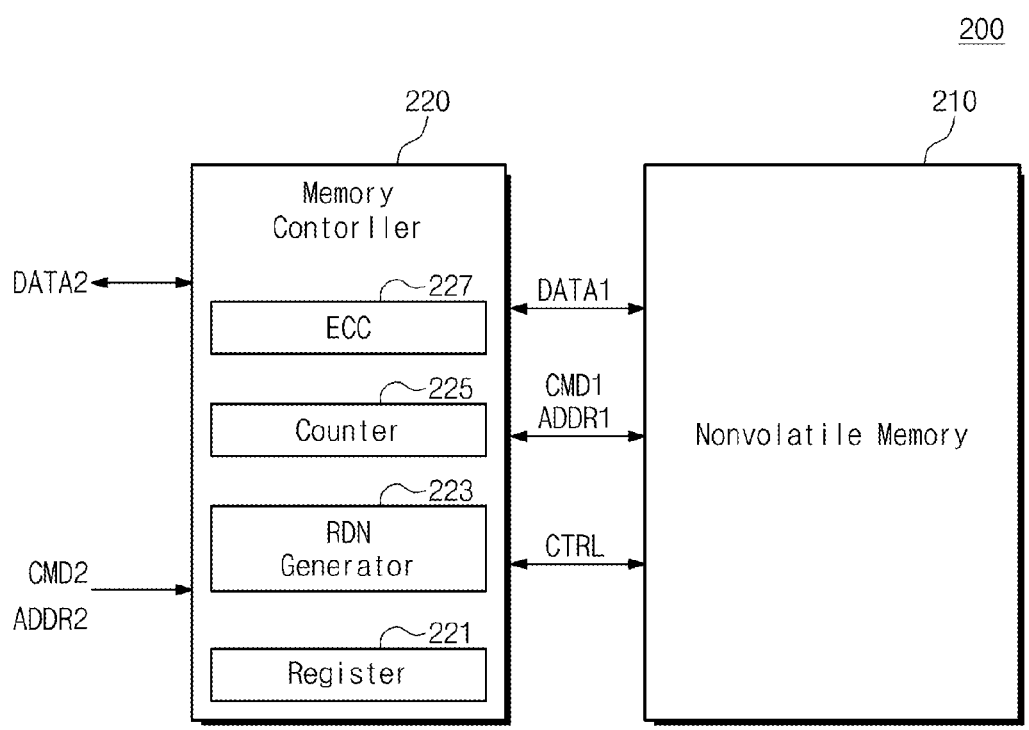
FIG. 30 is a block diagram schematically illustrating a storage device according to another embodiment of the inventive concept.

FIG. 30 is a block diagram schematically illustrating a storage device 200 according to another embodiment of the inventive concept. Referring to FIG. 30, the storage device 200 may include a non-volatile memory 210 and a memory controller 220. The memory controller 220 may include a register 221, a random number generator 223, a counter 225, and an error correction block 227.

Compared with the storage device 100 of FIG. 1, the storage device 200 does not have the RAM 130. The operations of FIG. 1 associated with the RAM 130 may be executed by a RAM provided in the memory controller 220.

Figure 31:
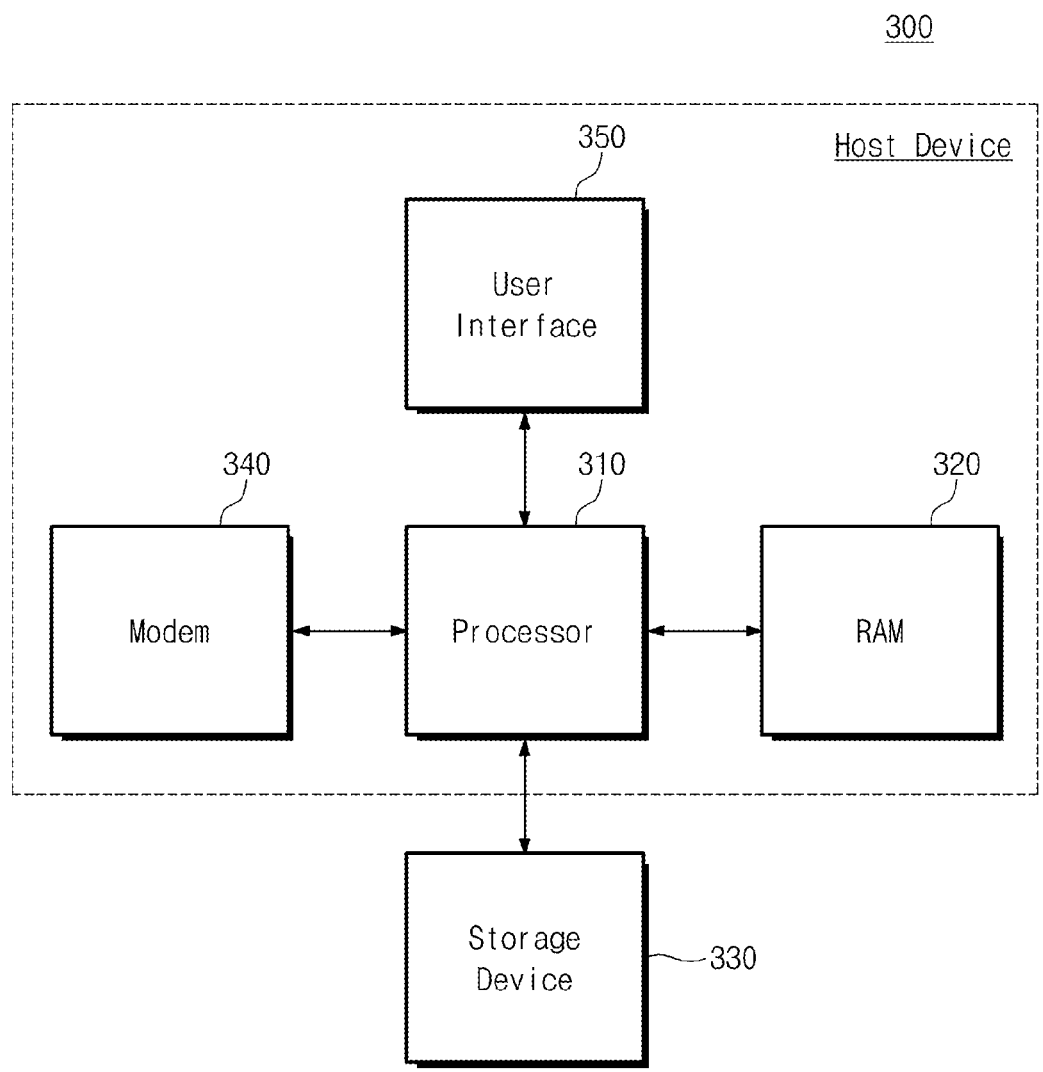
FIG. 31 is a block diagram schematically illustrating a computing device according to example embodiments of the inventive concept.

FIG. 31 is a block diagram schematically illustrating a computing device 300 according to example embodiments of the inventive concept. Referring to FIG. 31, computing device 300 may include a processor 310, a memory 1200, a storage device 330, a modem 340, and a user interface 350.

The processor 310 controls an overall operation of the computing device 300 and performs a logical operation. The processor 310 is formed of a system-on-chip (SoC). The processor 310 may be a general purpose processor, a specific-purpose processor, or an application processor.

The RAM 320 communicates with the processor 310. The RAM 320 may be a working memory of the processor 310 or the computing device 300. The processor 310 stores codes or data in the RAM 320 temporarily. The processor 310 executes codes using the RAM 320 and processes data. The processor 310 executes a variety of software, such as, but not limited to, an operating system and an application, using the RAM 320. The processor 310 controls an overall operation of the computing device 300 using the RAM 320. The RAM 320 may include a volatile memory such as, but not limited to, a static RAM, a dynamic RAM, a synchronous DRAM, and so on or a non-volatile memory such as, but not limited to, a Phase-change RAM (PRAM), a Magnetic RAM (MRAM), a Resistive RAM (RRAM), a Ferroelectric RAM (FRAM), and so on.

The storage device 330 communicates with the processor 310. The storage device 330 is used to store data for a long time. That is, the processor 110 stores data, which is to be stored for a long time, in the storage device 330. The storage device 330 stores a boot image for driving the computing device 300. The storage device 330 stores source codes of a variety of software, such as an operating system and an application. The storage device 330 stores data that is processed by a variety of software, such as an operating system and an application.

In exemplary embodiments, the processor 310 drives a variety of software, such as an operating system and an application, by loading source codes stored in the storage device 330 onto the RAM 320 and executing codes loaded onto the RAM 320. The processor 310 loads data stored in the storage device 330 onto the RAM 330 and processes data loaded onto the RAM 320. The processor 310 stores data, to be retained for a long time, of data stored in the RAM 320 in the storage device 330.

The storage device 330 includes a non-volatile memory, such as, but not limited to, a flash memory, a PRAM (Phase-change RAM), an MRAM (Magnetic RAM), an RRAM (Resistive RAM), an FRAM (Ferroelectric RAM), and so on.

The modem 340 communicates with an external device under the control of the processor 310. For example, the modem 340 communicates with the external device in a wire or wireless manner. The modem 340 may communicate with the external device, based on at least one of wireless communications manners such as LTE (Long Term Evolution), WiMax, GSM (Global System for Mobile communication), CDMA (Code Division Multiple Access), Bluetooth, NFC (Near Field Communication), WiFi, RFID (Radio Frequency Identification, and so on or wire communications manners such as USB (Universal Serial Bus), SATA (Serial AT Attachment), HSIC (High Speed Interchip), SCSI (Small Computer System Interface), Firewire, PCI (Peripheral Component Interconnection), PCIe (PCI express), NVMe (Non-volatile Memory express), UFS (Universal Flash Storage), SD (Secure Digital), SDIO, UART (Universal Asynchronous Receiver Transmitter), SPI (Serial Peripheral Interface), HS-SPI (High Speed SPI), RS232, I2C (Inter-integrated Circuit), HS-I2C, I2S, (Integrated-interchip Sound), S/PDIF (Sony/Philips Digital Interface), MMC (MultiMedia Card), eMMC (embedded MMC), and so on.

The user interface 350 communicates with a user, under the control of the processor 310. For example, the user interface 350 may include user input interfaces such as a keyboard, a keypad, a button, a touch panel, a touch screen, a touch pad, a touch ball, a camera, a microphone, a gyroscope sensor, a vibration sensor, and so on. The user interface 350 may further include user output interfaces such as an LCD, an OLED (Organic Light Emitting Diode) display device, an AMOLED (Active Matrix OLED) display device, an LED, a speaker, a motor, and so on.

The storage device 330 may include at least one of the storage devices 100 and 200 according to example embodiments of the inventive concept. The processor 310, the RAM 320, the modem 340, and the user interface 350 may be configured to serve as a host device communicating with the storage device 330.

According to example embodiments of the inventive concept, when a read operation is performed on a specific cell, reliability of data stored in neighboring cells may be checked. This makes it possible to realize a highly-reliable storage device and an operation method thereof.

While example embodiments of the inventive concepts have been particularly shown and described, it will be understood by one of ordinary skill in the art that variations in form and detail may be made therein without departing from the spirit and scope of the attached claims.

What is claimed is:

1. A method of operating a storage device including a non-volatile memory and a memory controller configured to control the non-volatile memory, wherein the non-volatile memory comprises:
   a plurality of cell strings, which are arranged in rows and columns on a substrate, each cell string comprising a ground selection transistor, a plurality of memory cells, and a string selection transistor sequentially stacked on the substrate in a direction normal to a top surface of the substrate, the memory cells of each cell string located at different levels over the top surface of the substrate;
   first to M-th string selection lines connected to first to M-th rows of the plurality of cell strings respectively; and
   first to N-th word lines connected to first to N-th levels of memory cells of the plurality of cell strings respectively,
   the method comprising:
      receiving a read command and a read address;
      performing a read operation on selected memory cells corresponding to a selected string selection line and a selected word line, which are selected based on the read address, according to the read command; and
      performing a reliability verification read on unselected memory cells corresponding to an unselected string selection line that, during the read operation, is unselected, wherein
   data read by the read operation are output to an external device, and data read by the reliability verification read are not output to the external device.

2. The method of claim 1, wherein the performing of the reliability verification read comprises performing the reliability verification read on memory cells corresponding to the selected word line.

3. The method of claim 1, wherein the performing of the reliability verification read comprises performing the reliability verification read on memory cells corresponding to an unselected word line adjacent to the selected word line.

4. The method of claim 1, wherein the performing of the reliability verification read further comprises performing the reliability verification read on memory cells corresponding to the selected string selection line and at least one unselected word line adjacent to the selected word line.

5. The method of claim 1, wherein the performing of the reliability verification read comprises performing the reliability verification read on memory cells that are in an erased state.

6. The method of claim 1, wherein the performing of the reliability verification read comprises performing the reliability verification read on memory cells corresponding to a predetermined position.

7. The method of claim 1, wherein:
   the reliability verification read is performed when a count that is incremented with each read operation reaches a random number, and
   the random number is updated and the count is reset when the reliability verification read is performed.

8. The method of claim 7, wherein the random number is updated in such a way that the random number is generated within a predetermined range or has a predetermined mean value.

9. The method of claim 8, wherein the predetermined range or the mean value decreases with an increase in the number of erase operations performed on memory cells of the plurality of cell strings.

10. The method of claim 8, wherein the predetermined range or the mean value decreases with an increase in the number of read operations performed on memory cells, in which data are written.

11. The method of claim 8, wherein the predetermined range or the mean value decreases with an increase in the time elapsed from completion of a program operation of memory cells of the plurality of cell strings.

12. The method of claim 1, wherein the performing of the reliability verification read comprises:
   performing the reliability verification read on memory cells corresponding to a first unselected string selection line and the selected word line;
   performing the reliability verification read on memory cells corresponding to a second unselected string selection line and a first unselected word line adjacent to the selected word line; and
   performing the reliability verification read on memory cells corresponding to the selected string selection line and a second unselected word line adjacent to the selected word line.

13. The method of claim 1, wherein the performing of the reliability verification read comprises:
   performing the reliability verification read on memory cells corresponding to a first unselected string selection line and the selected word line, when a first count that increments with each read operation reaches a first random number;
   performing the reliability verification read on memory cells corresponding to a second unselected string selection line and a first unselected word line adjacent to the selected word line, when a second count that increments with each read operation reaches a second random number; and
   performing the reliability verification read on memory cells corresponding to the selected string selection line and a second unselected word line adjacent to the selected word line, when a third count that increments with each read operation reaches a third random number.

14. The method of claim 1, wherein the performing of the reliability verification read comprises:
   generating a random number;
   performing the reliability verification read on memory cells corresponding to a first unselected string selection line and the selected word line, when the random number is within a first range;
   performing the reliability verification read on memory cells corresponding to a second unselected string selection line and a first unselected word line adjacent to the selected word line, when the random number is within a second range; and
   performing the reliability verification read on memory cells corresponding to the selected string selection line and a second unselected word line adjacent to the selected word line, when the random number is within a third range.

15. The method of claim 1, further comprising prohibiting memory cells of the plurality of cell strings from being written, when memory cells, on which the reliability verification read has been performed, are in an erased state and a bit error rate of the reliability verification read is higher than or equal to a critical value.

16. The method of claim 1, further comprising performing a read reclaim, when memory cells, on which the reliability verification read has been performed, are not in an erased state and a bit error rate of the reliability verification read is higher than or equal to a critical value.

17. The method of claim 16, wherein the performing of the read reclaim comprises performing a first read reclaim on data of the memory cells on which the reliability verification read has been performed.

18. The method of claim 17, wherein the performing of the read reclaim further comprises performing a second read reclaim on data of remaining memory cells, after the performing of the first read reclaim.

19. The method of claim 1, wherein:
the nonvolatile memory comprises a plurality of memory blocks, each memory block including the plurality of cell strings, and
the selected memory cells and the unselected memory cells belong to the same memory block.

20. The method of claim 1, wherein the performing of the reliability verification read comprises:
performing the reliability verification read on memory cells corresponding to a selected string selection line and located at least one of upper level and lower level of the selected memory cells over the substrate; and
performing the reliability verification read on memory cells corresponding to an unselected string selection line and located at least one of the upper level and the lower level of the selected memory cells.

21. A method of operating a storage device including a non-volatile memory and a memory controller configured to control the non-volatile memory, wherein the non-volatile memory comprises a plurality of cell strings arranged in rows and columns on a substrate, each cell string comprising a ground selection transistor, a plurality of memory cells, and a string selection transistor sequentially stacked on the substrate in a direction normal to a top surface of the substrate, the method comprising:
receiving a read command and a read address;
reading data from memory cells selected by the read address and outputting the read data to an external device, in response to the read command;
reading data from unselected memory cells unselected by the read address and corresponding to an unselected string selection line that, during the reading of data in response to the read command, is unselected; and
determining whether to perform a read reclaim on the unselected memory cells, based on the result of the reading on the unselected memory cells, in response to the read command.

22. The method of claim 21, wherein:
the nonvolatile memory comprises a plurality of memory blocks, each memory block including the plurality of cell strings, and
the selected memory cells and the unselected memory cells belong to the same memory block.

23. A storage device comprising:
a non-volatile memory including a plurality of cell strings arranged in rows and columns on a substrate, each cell string including a ground selection transistor, a plurality of memory cells, and a string selection transistor sequentially stacked on the substrate in a direction normal to a top surface of the substrate; and
a memory controller configured to control the non-volatile memory, wherein the memory controller is configured to:
read data from selected memory cells of the non-volatile memory in response to a request from an external device,
read data from unselected memory cells corresponding to an unselected string selection line that, during the reading of data in response to the request from the external device, is unselected, and
determine whether to perform a read reclaim on the unselected memory cells, depending on the result of the reading on the unselected memory cells.

24. The storage device of claim 23, wherein:
the rows of the cell strings are connected to string selection lines respectively,
memory cells having the same level over the substrate are connected to the same word line,
memory cells having different levels over the substrate are connected to different word lines respectively, and
the unselected memory cells correspond to a selected word line.

25. The storage device of claim 23, wherein:
the rows of the cell strings are connected to string selection lines respectively,
memory cells having the same level over the substrate are connected to the same word line,
memory cells having different levels over the substrate are connected to different word lines respectively, and
the unselected memory cells corresponds to an unselected word line adjacent to a selected word line.

26. The storage device of claim 23, wherein:
the rows of the cell strings are connected to string selection lines respectively,
memory cells having the same level over the substrate are connected to the same word line,
memory cells having different levels over the substrate are connected to different word lines respectively, and
the unselected memory cells correspond to multiple unselected word lines, each of which is adjacent to a selected word line.

27. The storage device of claim 23, wherein:
the non-volatile memory includes a plurality of memory blocks, each memory block including the plurality of cell strings, and
wherein the selected memory cells and the unselected memory cells belong to the same memory block.

28. The storage device of claim 23, wherein:
the rows of the cell strings are connected to string selection lines respectively, and
the unselected string selection line is located at an upper level or a lower level of the selected memory cells.

29. The storage device of claim 23, wherein the memory controller is configured to perform normal read operations according to subsequent requests from the external device alternately with reliability verification reads, the reliability verification reads reading data from the unselected memory cells.

30. A storage device comprising:
a non-volatile memory including a plurality of memory blocks, each memory block including a plurality of cell strings arranged in rows and columns on a substrate, each cell string including a ground selection transistor, a plurality of memory cells, and a string selection transistor sequentially stacked on the substrate in a direction normal to a top surface of the substrate; and a memory controller configured to control the non-volatile memory, wherein:

the memory controller is configured to receive a read command and a read address, perform a read operation on selected memory cells corresponding to a selected string selection line and a selected word line according to the read address, output data read by the read operation to an external device, and perform a reliability verification read on unselected memory cells corresponding to an unselected string selection line that, during the read operation, is unselected, data read by the reliability verification read are not output to the external device, and the selected memory cells and the unselected memory cells belong to the same memory block.

* * * * *